United States Patent
Kobayashi et al.

(10) Patent No.: US 10,862,469 B2
(45) Date of Patent: Dec. 8, 2020

(54) NANO POWER UNDER-VOLTAGE LOCKOUT CIRCUITS (UVLO) USING FLIPPED-GATE MOS

(71) Applicant: Dialog Semiconductor (UK) Limited, London (GB)

(72) Inventors: Daisuke Kobayashi, Tokyo (JP); Soichiro Ohyama, Kanagawa (JP)

(73) Assignee: Dialog Semiconductor (UK) Limited, London (GB)

(*) Notice: Subject to any disclaimer, the term of this patent is extended or adjusted under 35 U.S.C. 154(b) by 558 days.

(21) Appl. No.: 15/727,775

(22) Filed: Oct. 9, 2017

(65) Prior Publication Data
US 2019/0109589 A1    Apr. 11, 2019

(51) Int. Cl.
| | |
|---|---|
| H02H 3/24 | (2006.01) |
| H03K 5/24 | (2006.01) |
| H02H 1/00 | (2006.01) |
| H02H 9/00 | (2006.01) |
| H02H 7/00 | (2006.01) |

(52) U.S. Cl.
CPC ......... *H03K 5/2472* (2013.01); *H02H 1/0007* (2013.01); *H02H 3/24* (2013.01); *H02H 3/243* (2013.01); *H02H 7/00* (2013.01); *H02H 9/00* (2013.01); *H03K 5/24* (2013.01)

(58) Field of Classification Search
USPC ...................................... 361/18, 92
See application file for complete search history.

(56) References Cited

U.S. PATENT DOCUMENTS

| 6,600,639 B1* | 7/2003 | Teo ......................... G05F 3/247 |
| | | 361/18 |
| 7,310,251 B2 | 12/2007 | Yang et al. |
| 7,450,359 B1 | 11/2008 | Mei et al. |
| 9,590,504 B2 | 3/2017 | Ai-Shyoukh et al. |

(Continued)

OTHER PUBLICATIONS

Application Report SLVA769, "Understanding Undervoltage Lockout in Display Power Devices," by Nigel Smith, Copyright: Texas Instruments Incorporated, Apr. 2016, 6 pgs.

(Continued)

*Primary Examiner* — Danny Nguyen
(74) *Attorney, Agent, or Firm* — Saile Ackerman LLC; Stephen B. Ackerman; Billy Knowles

(57) ABSTRACT

An under-voltage lockout (UVLO) circuit configured for indicating that an electronic device may be enabled and disabled based on threshold levels of a power supply voltage. The UVLO circuit has a non-differential comparator configured to have a fixed threshold voltage. A voltage divider having a first terminal connected to the power supply voltage and configured to adapt a compare signal applied to the non-differential comparator to be proportional the power supply voltage such that a desired threshold voltage for the power supply voltage causes the non-differential comparator to change its output state. The UVLO circuit has a hysteresis controller configured for adjusting the compare voltage such that the power supply voltage has at least two threshold voltages to cause the non-differential comparator to change states. The non-differential comparator comprises a flipped gate transistor with a gate-to-source threshold greater than a normally gated transistor.

59 Claims, 10 Drawing Sheets

(56) References Cited

U.S. PATENT DOCUMENTS

| | | | | |
|---|---|---|---|---|
| 2006/0227477 A1* | 10/2006 | Sheng | ............... | G01R 19/16552 |
| | | | | 361/92 |
| 2010/0244912 A1* | 9/2010 | Chen | ....................... | H03K 17/22 |
| | | | | 327/143 |
| 2014/0146429 A1* | 5/2014 | Lee | ......................... | H02H 3/243 |
| | | | | 361/86 |
| 2015/0234413 A1 | 8/2015 | Ai-Shyoukh et al. | | |

OTHER PUBLICATIONS

"MOS Voltage Reference Based on Polysilicon Gate Work Function Difference," by Henri J. Oguey et al., IEEE Journal of Solid-State Circuits, vol. SC-15, No. 3, Jun. 1980, pp. 264-269.

"A 500nA Quiescent Current, Trim Free, ±1.75% Absolute Accuracy, CMOS-Only Voltage Reference based in Anti-Doped N-Channel MOSFETs," by Mohammad Al-Shyoukh et al., Proceedings of the IEEE 2014 Custom Integrated Circuits Conference, Sep. 2014, 4 pgs.

\* cited by examiner

NANO POWER UNDER-VOLTAGE LOCKOUT CIRCUITS (UVLO) USING FLIPPED-GATE MOS

TECHNICAL FIELD

The disclosure generally relates to under-voltage lockout (UVLO) circuits and more particularly to UVLO circuits employing an anti-doped (flipped gate) MOS transistor as a comparator.

BACKGROUND

Application Report SLVA769 "Understanding Under-Voltage Lockout in Display Power Devices" (Smith), © Texas Instruments, Post Office Box 655303, Dallas, Tex. 75265, April 2016, pp: 1-5, explains the need for an under-voltage lockout function for low power electronic devices such as wearable devices that are designed to operate with low supply voltages. These low power electronic devices require power consumption in the nano-ampere range and are designed for operating with low voltage power supplies such as batteries. It is especially important in battery-powered applications, where the available voltage decreases as the battery discharges, that these devices have a minimum voltage to operate correctly. When the power supply is operating at too low a voltage level, the device may have problems develop including an incorrect voltage for a band-gap reference circuit, logic function being in indeterminate states, power transistors may not completely turned off or turned on, and other problems. To prevent these problems, an under-voltage lockout circuit insures that the device is not functioning until the power supply is operating at a sufficient voltage for the device to operate predictably.

FIG. 1 is a graphical representation of the different power supply modes that a low power electronic device typically encounters. When the power supply voltage $V_{dd}$ is below the rising and falling minimum UVLO thresholds $V_{T+RMIN}$ and $V_{T-FMIN}$, the electronic device is off 5 and 30. All the internal circuitry of the electronic device except the UVLO circuit itself are disabled. The input supply current when the device is off is typically very small.

In the regions 15 and 35, the supply voltage is above the rising and falling maximum UVLO thresholds $V_{T+RMAX}$ and $V_{T-FMAX}$ but below the recommended minimum operating voltage $V_{dd\_MAX}$ and all the device functions are enabled, but full performance is not specified. For example, a dc-dc converter operating in this region may regulate correctly but not be able to deliver its full output current. Full performance is specified only if the power supply voltage Vdd lies in the region 20 between the minimum and maximum operating conditions $V_{dd\_MIN}$ and $V_{dd\_MAX}$.

UVLO thresholds are specified with some tolerance to allow for process and temperature variations. There are undefined regions 10 and 35 of supply voltage amplitude between the rising and falling maximum UVLO thresholds $V_{T+RMAX}$ and $V_{T-FMAX}$ and the rising and falling minimum UVLO thresholds $V_{T+RMIN}$ and $V_{T-FMIN}$ within which the functionality of the device is not guaranteed. This does not mean that the device behavior is completely unpredictable. It means the device is either off or functional, but which of the two states the device operates is unspecified, because it depends on where exactly in the undefined regions 10 and 35 the UVLO threshold lies.

FIG. 2a is a schematic drawing of a UVLO circuit 100 of prior art. FIG. 2b is a plot of the output voltage $V_{DOUT}$ of the UVLO circuit 100 of prior art versus the voltage level of a power supply voltage source $V_{dd}$. The UVLO circuit has a voltage divider 105 that is formed of the serially connected resistors $R_1$, $R_2$, and $R_3$. The first terminal of the resistor $R_1$ is connected to an input terminal connected to the power supply voltage source $V_{dd}$. The second terminal of the resistor $R_1$ is connected to the first terminal of the resistor $R_2$. The second terminal of the resistor $R_2$ is connected to the first terminal of the resistor $R_3$. The second terminal of the resistor $R_3$ is connected to the first terminal of the reference current source 120 that provides a constant reference current $I_{REF}$. The second terminal of the resistor $R_3$ is also connected to the first terminal of the trim current source 130 that provides the trim current $I_{TRIM}$. The trim current source 130 is connected to input terminal that provides a trim control signal TRIM that adjusts the amplitude of the trim current $I_{TRIM}$. The second terminals of the reference current source 120 and the trim current source 130 are connected to the terminal that is connected to the ground reference voltage source $V_{SS}$.

The UVLO circuit 100 has a comparator 110 with an inverting input (−) that is connected to the junction of the connection of the serially connected resistors $R_2$, and $R_3$ of the voltage divider 105. The voltage $V_1$ is developed at the junction of the serially connected resistors $R_2$, and $R_3$. The noninverting input (+) of the comparator 110 is connected to a terminal connected to a reference voltage source that provides the reference voltage $V_{REF}$. Typically, the reference voltage source 130 is constructed on a bandgap reference voltage (i.e. approximately 1.2V) thus making the reference voltage $V_{REF}$ equal to the bandgap reference voltage. The serially connected resistors $R_1$ and $R_2$ and the reference current source 120 the hysteresis current source 125 provide the currents $I_{REF}$ and $I_{HYS}$ to generate the voltage $V_1$ to the inverting (−) input of the comparator 110. The voltage $V_1$ is compared to the reference voltage $V_{REF}$ to determine if the power supply voltage source $V_{dd}$ is greater than or less than a rising threshold voltage $V_{TR}$ and a falling threshold voltage $V_{TF}$. If the power supply voltage source $V_{dd}$ is greater than a rising threshold voltage $V_{TR}$ or a falling threshold voltage $V_{TF}$, the output signal DOUT of the comparator 110 indicates that the circuits of an electronic device are activated and functioning correctly. If the power supply voltage source $V_{dd}$ is less than a rising threshold voltage $V_{TR}$ or a falling threshold voltage $V_{TF}$, the output signal DOUT of the comparator 110 indicates that the circuits of an electronic device are activated and functioning correctly.

The output of the comparator 110 is connected to the input of the buffer 115. The buffer 115 amplifies and conditions the output signal of the comparator 110 to generate the output signal DOUT of the comparator 110 for transfer to the circuits of the electronic device. Further, the output of the comparator 110 is connected to the gate of the PMOS transistor $M_{PHYS}$. The drain of the PMOS transistor $M_{PHYS}$ is connected to the junction of the serially connected resistors $R_1$, $R_2$. The source of the PMOS transistor $M_{PHYS}$ is connected to the terminal of the power supply voltage source $V_{dd}$. Also, the output of the comparator 110 is connected to the gate of the NMOS transistor $M_{NHYS}$. The drain of the NMOS transistor $M_{NHYS}$ is connected to the junction of the resistor $R_3$, the reference current source 120 and the trim current source 130. The source of the NMOS transistor $M_{NHYS}$ is connected to the first terminal of the Hysteresis current source 125.

As noted above, the voltage $V_1$ is compared to the reference voltage $V_{REF}$. When the power supply voltage source $V_{dd}$ is rising from a zero level, the comparator 110 compares the voltage $V_1$ with reference voltage $V_{REF}$. When the voltage $V_1$ becomes equal to the reference voltage $V_{REF}$, the output DOUT of the comparator 110 is activated to voltage level of a logical 1. Therefore, the rising threshold voltage $V_{TR}$ can be expressed in the following equation:

$$V_{TR}=V_{REF}+(R_1+R_2)*I_{REF} \quad (1)$$

Where:
$V_{TR}$ is the rising threshold voltage;
$V_{REF}$ is the reference voltage;
$R_1$ is the first resistor of the voltage divider 105;
$R_2$ is the second resistor of the voltage divider 105;
$I_{REF}$ is the reference current.

When the power supply voltage source $V_{dd}$ is falling from its operating voltage level, the comparator 110 compares the voltage $V_1$ with reference voltage $V_{REF}$. When the voltage $V_1$ becomes equal to the reference voltage $V_{REF}$, the output DOUT of the comparator 110 is deactivated to voltage level of a logical 0. Therefore, the falling threshold voltage $V_{TF}$ can be expressed in the following equation:

$$V_{TF}=V_{REF}+R_2(I_{REF}+I_{HYS}) \quad (2)$$

Where:
$V_{TF}$ is the falling threshold voltage;
$V_{REF}$ is the reference voltage;
$R_2$ is the second resistor of the voltage divider 105;
$I_{REF}$ is the reference current;
$I_{HYS}$ is the hysteresis current.

Therefore, the hysteresis width can be calculated according to the following equation:

$$V_{HYS}=R_1*I_{REF}+R_2*I_{HYS} \quad (3)$$

Where:
$V_{HYS}$ is the hysteresis voltage;
$R_1$ is the first resistor of the voltage divider 105;
$R_2$ is the second resistor of the voltage divider 105;
$I_{REF}$ is the reference current;
$I_{HYS}$ is the hysteresis current.

The rising threshold voltage $V_{TR}$, the falling threshold voltage $V_{TF}$, and the hysteresis voltage $V_{HYS}$ achieved by setting the resistor ratios of the voltage divider 105. The trim current $I_{TRIM}$ is adjusted to cancel comparator offset and process variation of the serially connected resistors $R_1$, $R_2$, and $R_3$.

Referring to FIG. 2b, the voltage level of the power supply voltage source $V_{dd}$ rises from a zero voltage, the voltage level $V_{DOUT}$ of the output DOUT of the comparator 110 remains at the deactivated level $V_0$ that is at a voltage level of approximately zero volts. When the voltage level of the power supply voltage source $V_{dd}$ reaches the voltage level of the rising threshold voltage $V_{TR}$, the voltage level $V_{DOUT}$ of the output DOUT of the comparator 110 rises to the activated level $V_{R1}$ of a voltage level of approaching the voltage level of the power supply voltage source $V_{dd}$. The electronic device becomes fully operational, as described in FIG. 1.

If the power supply voltage source $V_{dd}$ is a battery, it will begin to lose charge over time and the voltage level of the power supply voltage source $V_{dd}$ begins to fall. When the voltage level of the power supply voltage source $V_{dd}$ reaches the voltage level of the falling threshold voltage $V_{TF}$, the voltage level $V_{DOUT}$ of the output DOUT of the comparator 110 falls from the activated level $V_{F1}$ to the deactivated level (0) or approximately zero volts. The electronic device is turned off, as described in FIG. 1.

The circuit of FIG. 2a has relatively large die area and large current consumption. Further, the reference voltage source $V_{REF}$ has a small bias current and is subject to kick-back noise. The kick-back noise can cause voltage level of the reference voltage source $V_{REF}$ to be shifted, thus causing improper operation of the lockout circuit 100.

SUMMARY

An object of this disclosure is to provide a comparison circuit for comparing two signal for determining if one signal is greater than or lesser than a second signal.

Another object of this disclosure is to provide a UVLO circuit for determining if voltage level of a power supply voltage source has risen or fallen such that circuits of an electronic device are fully functional or should be turned off.

Further, another object of this disclosure is to reduce kick-back to a reference voltage source to lessen noise that cause shift in the voltage level of the reference voltage source.

To accomplish at least one of these objects, a comparison circuit is configured for comparing two input voltages and determining if a first input voltage is greater than or lesser than a second. The comparison circuit has a non-differential comparator that includes a flipped gate transistor and a reference current source. The reference current source has a first terminal connected to a power supply voltage source and a second terminal connected to a drain of the flipped gate transistor. The source of the flipped gate transistor is connected to a ground reference voltage source.

The comparison circuit has a voltage divider that is connected to the gate of the flipped gate transistor. The voltage divider has a first resistor with a first terminal connected for receiving the first input voltage. A second terminal of the first resistor is connected to a gate of the flipped gate transistor.

The gate of the flipped gate transistor is connected to a drain of a normally gated transistor. The gate of the normally gated transistor is connected to receive the second. The source of the normally gated transistor is connected to a first terminal of a second resistor and a second terminal of the second resistor is connected to the ground reference voltage source. The normally gated transistor and the second resistor thus form a voltage to current converter where a conversion current flowing through the voltage to current converter is proportional to the second input voltage.

The comparison circuit further has an inverter buffer having an input connected to common connection of the drain of the flipped gate transistor and the second terminal of the reference current source. The output of the inverter buffer is connected to other circuitry of the electronic device. The inverter has a PMOS transistor and NMOS transistor. The source of the PMOS transistor is connected to the power supply voltage source. The drain of the PMOS transistor is connected to the drain of the NMOS transistor and to the output of the inverter buffer. The source of the NMOS transistor is connected to the ground reference voltage source. The gates of the PMOS transistor and NMOS transistor are connected and connected to the input of the inverter buffer.

The current flowing through the second resistor flows through the first resistor to establish a compare voltage at the gate of the flipped gate transistor. When the compare voltage at the gate of the flipped gate transistor is greater than the gate to source threshold voltage of the flipped gate transistor, the first input voltage is greater than the second and the flipped gate transistor turns on. The input to the inverter buffer becomes approximately the voltage level of the ground reference voltage source and the output of the inverter buffer becomes activated to a logical 1. When the compare voltage at the gate of the flipped gate transistor becomes is less than the gate to source threshold voltage of the flipped gate transistor, the first input voltage is less than the second and the flipped gate transistor turns off. The input to the inverter buffer becomes approximately the voltage level of the power supply voltage source and the output of the inverter buffer becomes deactivated to a logical 0.

In another embodiment, the comparison circuit has hysteresis controller. The hysteresis controller has a third resistor that is placed between the second resistor and the power supply voltage source such that a first terminal of the third resistor is connected to the power supply voltage source and a second terminal of the third resistor is connected to the first terminal of the second resistor. The hysteresis controller has a hysteresis control PMOS transistor with a source connected to the power supply voltage source and drain connected to the junction of the connection between third resistor and the second resistor. The gate of the hysteresis control PMOS transistor is connected to the junction of the reference current source and the drain of the flipped gate transistor. When the flipped gate transistor off, indicating that the first input voltage is less than the second, the hysteresis control transistor is also turned off and the threshold voltage for indicating that the first input voltage is less than the second and the output of the inverter buffer is set to the logical 0.

When the flipped gate transistor is turned on, the hysteresis control transistor is also turned on. This effectively shorts out the third resistor and changes the threshold and thus the relationship of the first input voltage to the second.

In various embodiments that accomplish at least one of the these objects, a UVLO circuit is configured for enabling and disabling an electronic device, if a power supply voltage source is at a device on threshold voltage level that permits the operation of the electronic devices. The UVLO circuit has a non-differential comparator that includes a flipped gate transistor and a reference current source. The reference current source has a first terminal connected to a power supply voltage source and a second terminal connected to a drain of the flipped gate transistor. The source of the flipped gate transistor is connected to a ground reference voltage source.

The UVLO Circuit has a voltage divider that is connected to the gate of the flipped gate transistor. The voltage divider has a first resistor with a first terminal connected to the power supply voltage source. A second terminal of the first resistor is connected to a first terminal of a second resistor. A second terminal of the second resistor is connected to a gate of the flipped gate transistor.

The gate of the flipped gate transistor is connected to a drain of a normally gated transistor. The gate of the normally gated transistor is connected to receive a reference voltage. The source of the normally gated transistor is connected to a first terminal of a third resistor and a second terminal of the third resistor is connected to the ground reference voltage source. The normally gated transistor and the third resistor thus form a voltage to current converter where a conversion current through the voltage to current converter is proportional to the reference voltage.

The UVLO Circuit further has an inverter buffer having an input connected to common connection of the drain of the flipped gate transistor and the second terminal of the reference current source. The output of the inverter buffer is connected to external circuitry for disabling the electronic device. The inverter has a PMOS transistor and NMOS transistor. The source of the PMOS transistor is connected to the power supply voltage source. The drain of the PMOS transistor is connected to the drain of the NMOS transistor and to the output of the inverter buffer. The source of the NMOS transistor is connected to the ground reference voltage source. The gates of the PMOS transistor and NMOS transistor are connected and connected to the input of the inverter buffer.

The current flowing through the third resistor flows through the first and second resistors to establish a compare voltage at the gate of the flipped gate transistor. When the compare voltage at the gate of the flipped gate transistor is greater than the threshold voltage of the flipped gate transistor, the amplitude of the power supply voltage source is greater than the device on threshold voltage and the flipped gate transistor turns on. The input to the inverter buffer becomes approximately the voltage level of the ground reference voltage source and the output of the inverter buffer becomes activated to a logical 1. The electrical device is activated to be fully functional. When the compare voltage at the gate of the flipped gate transistor becomes is less than the device threshold voltage of the flipped gate transistor, the voltage level of the power supply voltage source is less than the second and the flipped gate transistor turns off. The input to the inverter buffer becomes approximately the voltage level of the power supply voltage source and the output of the inverter buffer becomes deactivated to a logical 0. The electrical device is deactivated to be turned off.

The UVLO Circuit has a hysteresis controller configured for establishing the device on threshold voltage and a device off threshold voltage. The hysteresis controller includes the first resistor and a hysteresis control PMOS transistor. A source of the hysteresis control PMOS transistor connected to the power supply voltage source and a drain of the hysteresis control PMOS transistor is connected to the junction of the connection between third resistor and the second resistor. The gate of the hysteresis control PMOS transistor is connected to the junction of the reference current source and the drain of the flipped gate transistor. When the flipped gate transistor is turned off, indicating that the first input voltage is less than the second, the hysteresis control transistor is also turned off and the device on threshold voltage indicates that the amplitude of the power supply voltage source is less than the device off threshold voltage and the output of the inverter buffer is set to the logical 0 and the electronic device is turned off.

When the flipped gate transistor is turned on, output of the inverter buffer is activated to a logical 1 and the electronic device is turned on. At the same time the hysteresis control transistor is also turned on. This effectively shorts out the first resistor and changes the device off threshold voltage. When the power supply voltage becomes less the device off threshold voltage, the flipped gate transistor is turned off for setting the output of the inverter buffer to a logical 0 for turning off the electronic device.

In some embodiments, the voltage divider is structured to have multiple resistors where the second resistor is replaced by multiple serially connected resistors. The first terminal of a first resistor of the multiple serially connected resistors is connected to the second terminal of the first resistor and a second terminal of a last resistor of the multiple serially connected resistors is connected to the junction of the gate of the flipped gate transistor and the drain of the normally gated transistor.

Each junction of each of the terminals of the multiple serially connected resistors is connected to a first terminal of one switch of the multiple single pole switches. A second terminal of each of the multiple single pole switches is connected to a threshold selection current source. Only one switch of the multiple single pole switches is activated for adjusting the level for the threshold voltages for activating and deactivating the electronic device. Thus, the threshold for activating the electronic device and the threshold for deactivating the electronic device can be modified dependent upon the region of the amplitude of the voltage level of the power supply voltage source that provides full functionality for the electronic device.

DETAILED DESCRIPTION

The UVLO circuit of this disclosure has a non-differential comparator that uses the threshold voltage of a flipped gate transistor for determining if a voltage level of a power supply voltage source of an electronic device is sufficient for allowing fully functional operation. A voltage divider uses a reference voltage for establishing when the threshold voltage level of the power supply voltage source is at it functional voltage level. The voltage divider is connected to the gate of the flipped gate transistor and configured such that the threshold voltage level of the power supply voltage source is applied at the input of the UVLO circuit to provide the threshold voltage of the flipped gate transistor to turn on the flipped gate transistor. The voltage divider is structured such that the comparator function is defined by two different threshold voltages that differ by the bandgap of the semiconductor material from which the transistors are manufactured. To achieve the differences in the threshold levels, one transistor is a normal transistor as described in FIG. 3a and is manufactured using present materials and fabrication techniques and the second transistor is a flipped gate transistor as described in FIG. 3b.

Figure 1:
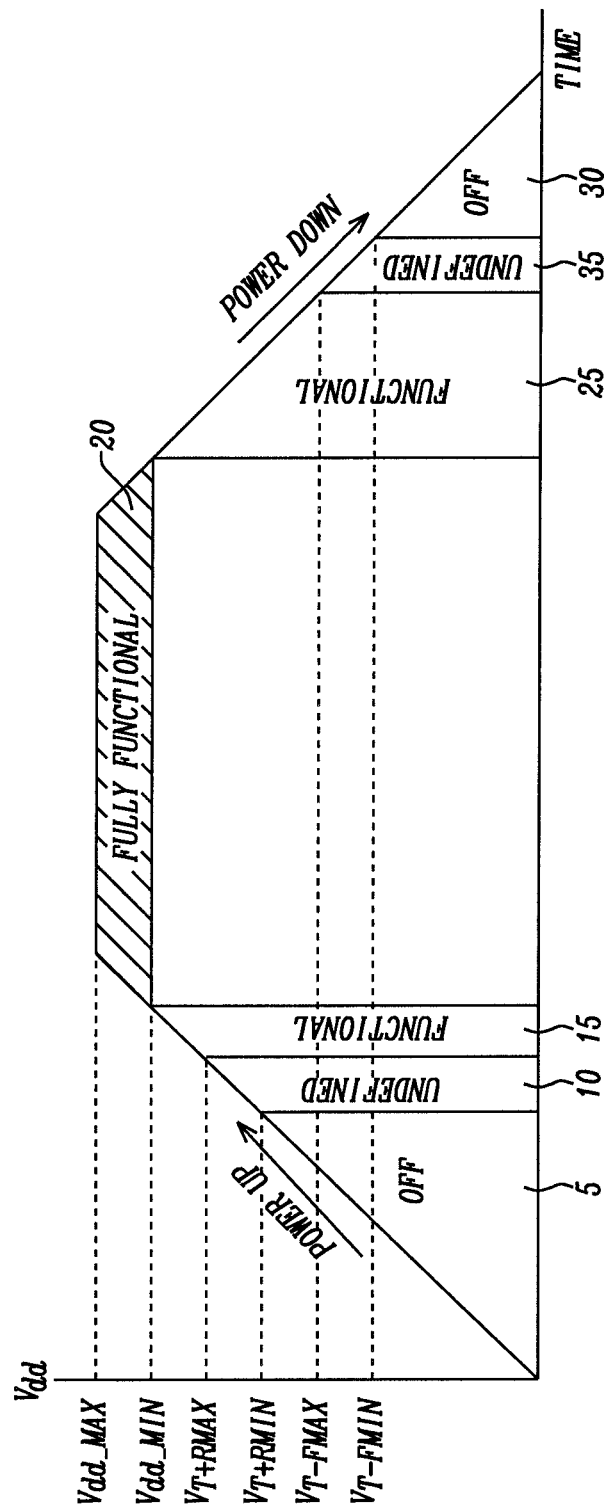
FIG. 1 is a graphical representation of the different power supply modes that a low power device typically encounters.
Figure 2A:
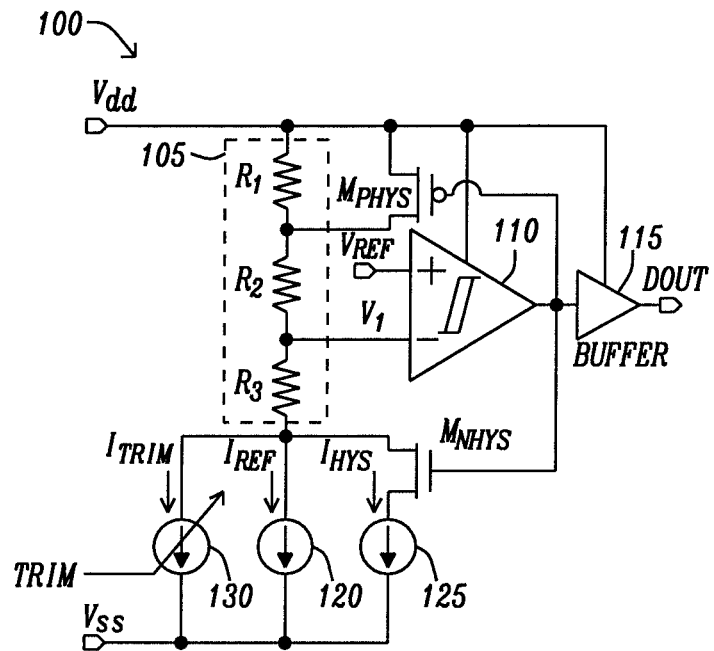
FIG. 2a is a schematic drawing of a UVLO circuit of prior art.
Figure 2B:
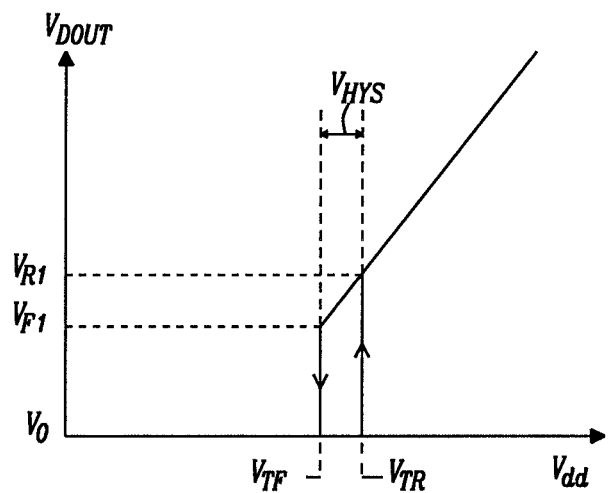
FIG. 2b is a plot of the output voltage of the UVLO circuit of prior art versus the voltage level of a power supply voltage source.
Figure 3A:
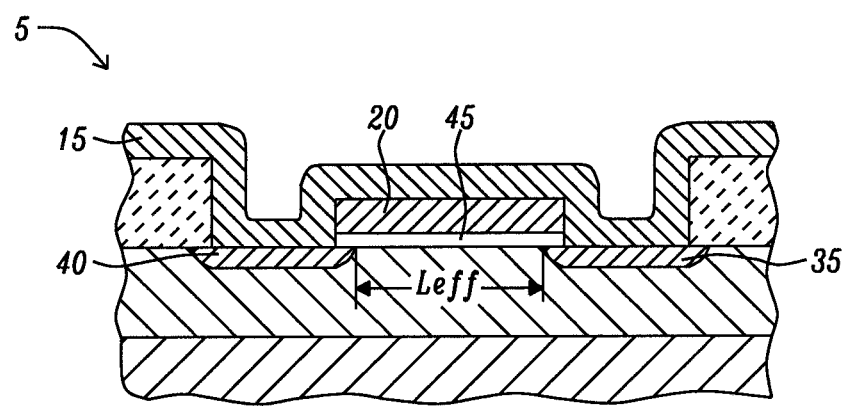
FIG. 3a is a cross sectional diagram of a normal MOS transistor of the related art.
Figure 3B:
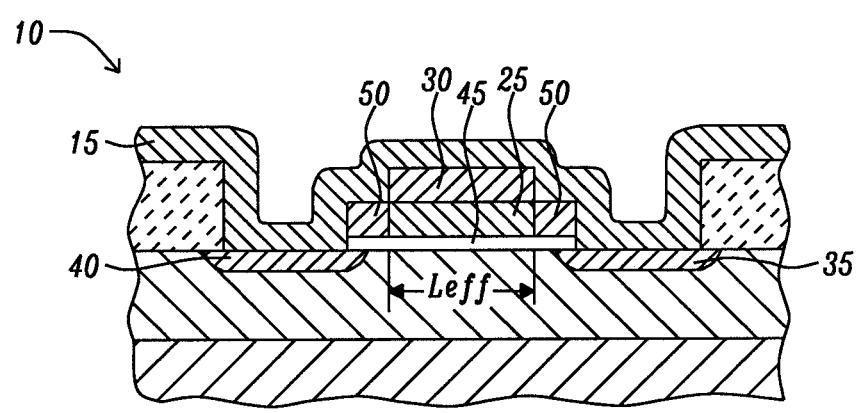
FIG. 3b is a cross sectional diagram of a Flipped-Gate MOS transistor of the related art.

FIGS. 3a and 3b are a cross sectional diagrams respectively of a MOS transistor and a flipped-gate MOS transistor of the related art. In the related art as shown in FIGS. 3a and 3b, a flipped-gate transistor (FIG. 3b) has a threshold voltage that is greater than the threshold voltage of a normal transistor. The normal transistor is defined is one that employs the standard processing currently in practice and is similar to that shown in FIG. 3a. "MOS voltage reference based on polysilicon gate work function difference," Oguey, et al., IEEE Journal of Solid-State Circuits, vol. 15, no. 3, pp. 264-269, June 1980 as reproduced in FIGS. 3a and 3b. Quoting from Oguey et al., FIG. 3a shows a standard n-channel transistor 5 with an n-type gate 20 and FIG. 3b modified n-channel transistor 10 with a p-type gate 25 fabricated with a technology that uses doped oxides as diffusion sources. In the standard transistor 5, gate 20, drain 35, and source 40 are surrounded by a phosphorus-doped oxide 15. Source 40 and drain 35 are self-aligned with the gate 20. Effective channel length Leff is gate length minus two lateral diffusion lengths. In the modified transistor, the center part of the gate 25 is p-doped by leaving above it a region of boron-doped oxide 30. This structure behaves like a higher threshold transistor of channel length Leff in series with two short-channel low-threshold transistors. The additional transistors 50 produce a negligible effect in weak inversion, but contribute to a larger change in gate threshold voltage at higher current levels.

Figure 4B:
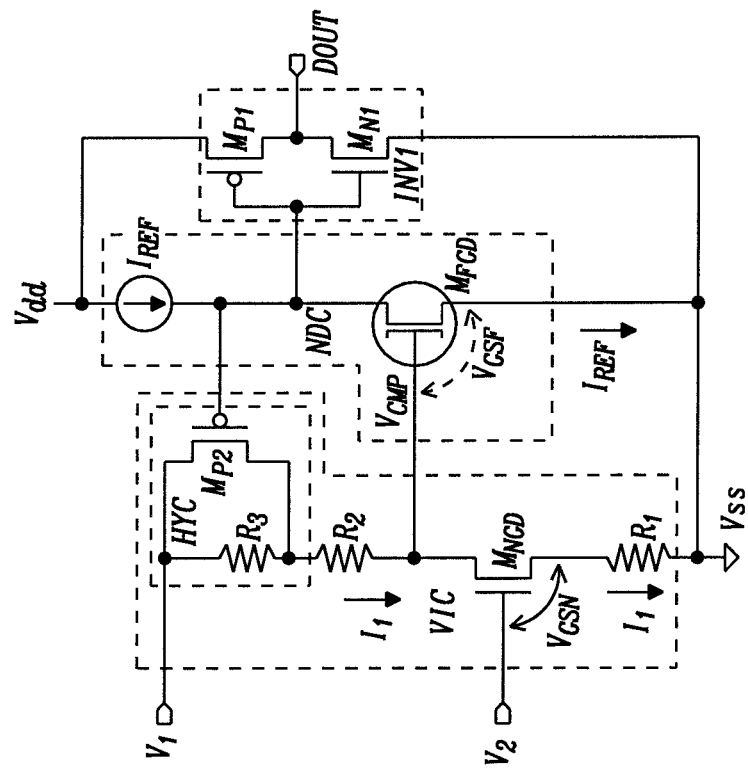
FIGS. 4a and 4b are schematic drawings of comparison circuits embodying the principles of the present disclosure.
Figure 4A:
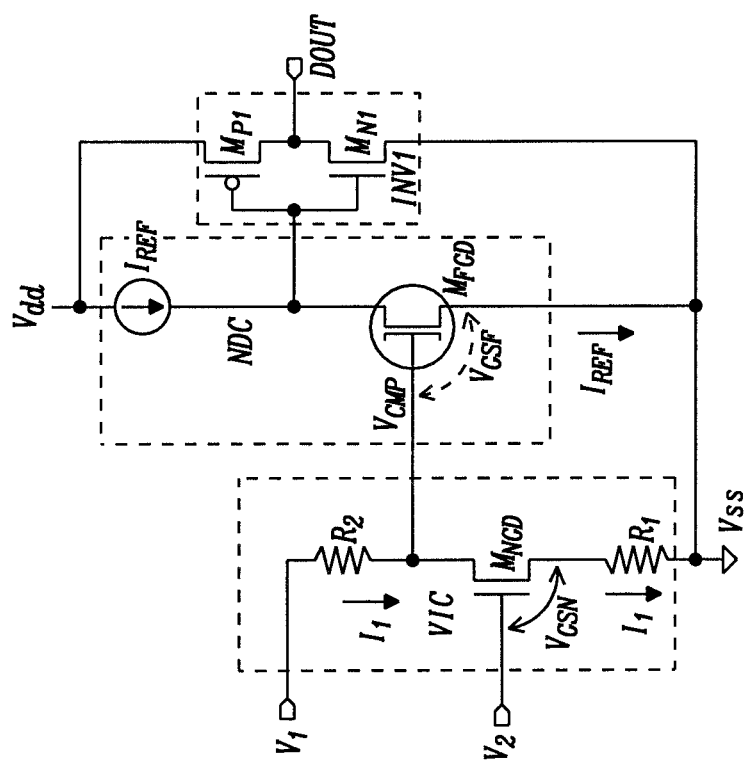

FIGS. 4a and 4b are schematic drawings of comparison circuits embodying the principles of the present disclosure. In FIG. 4a, a comparison circuit is configured for comparing two input voltages V1 and V2 and determining if a first input voltage V1 is greater than or lesser than threshold voltage $V_{TH}$ between the first input voltage V1 and a second input voltage V2. A bandgap voltage $V_{BANDGAP}$ given by a threshold voltage difference between a normally gated transistor $M_{NGD}$ and a flipped gate transistor $M_{FGD}$. Therefore, the threshold voltage $V_{TH}$ can be realized accurately with a voltage divider/current converter VIC having resistors $R_1$ and $R_2$ with almost same value. To be more accurate, a ratio $R_1/R_2$ of the resistors $R_1$ and $R_2$ can be chosen to compensate any non-idealities of the process and the temperature coefficient of the flipped gate transistor $M_{FGD}$.

The comparison circuit has a non-differential comparator NDC that includes the flipped gate transistor $M_{FGD}$ and a reference current source $I_{REF}$. The reference current source $I_{REF}$ has a first terminal connected to a power supply voltage source $V_{dd}$ and a second terminal connected to a drain of the flipped gate transistor $M_{FGD}$. The source of the flipped gate transistor $M_{FGD}$ is connected to a ground reference voltage source $V_{ss}$.

The comparison circuit includes the voltage divider/current converter VIC that is connected to the gate of the flipped gate transistor. The gate of the flipped gate transistor is connected to a drain of the normally gated transistor $M_{NGD}$. The gate of the normally gated transistor $M_{NGD}$ is connected to receive the second input voltage $V_2$. The source of the normally gated transistor $M_{NGD}$ is connected to a first terminal of a first resistor $R_1$ and a second terminal of the second resistor $R_1$ is connected to the ground reference voltage source $V_{ss}$. The normally gated transistor $M_{NGD}$ and the second resistor $R_1$ thus form a voltage to current converter where a conversion current $I_1$ flows through the voltage to current converter and is proportional to the second input voltage $V_2$.

The voltage divider/current converter VIC has a second resistor $R_2$ with a first terminal connected for receiving the first input voltage $V_1$. A second terminal of the second resistor $R_2$ is connected to the gate of the flipped gate transistor $M_{FGD}$.

The comparison circuit further has an inverter buffer INV1 having an input connected to the common connection of the drain of the flipped gate transistor $M_{FGD}$ and the second terminal of the reference current source $I_{REF}$. The output of the inverter buffer INV1 is connected to circuitry within the electronic device. The inverter has a PMOS transistor $M_{P1}$ and NMOS transistor $M_{N1}$. The source of the PMOS transistor $M_{P1}$ is connected to the power supply voltage source $V_{dd}$. The drain of the PMOS transistor $M_{P1}$ is connected to the drain of the NMOS transistor $M_{N1}$ and to the output DOUT of the inverter buffer INV1. The source of the NMOS transistor $M_{N1}$ is connected to the ground reference voltage source $V_{ss}$. The gates of the PMOS transistor $M_{P1}$ and NMOS transistor $M_{N1}$ are connected and connected to the input of the inverter buffer INV1 that is connected to common connection of the drain of the flipped gate transistor $M_{FGD}$ and the second terminal of the reference current source $I_{REF}$.

The conversion current flows through the second resistor $R_2$ to establish a compare voltage $V_{CMP}$ at the gate of the flipped gate transistor $M_{FGD}$. When the compare voltage $V_{CMP}$ at the gate of the flipped gate transistor is greater than the threshold voltage $V_{GSF}$ of the flipped gate transistor $M_{FGD}$, the first input voltage $V_1$ is greater than the second input voltage $V_2$ and the flipped gate transistor $M_{FGD}$ turns on. The input to the inverter buffer INV1 becomes approximately the voltage level of the ground reference voltage source $V_{ss}$ and the output DOUT of the inverter buffer INV1 becomes activated to a logical 1. When the compare voltage $V_{CMP}$ at the gate of the flipped gate transistor becomes is less than the threshold voltage $V_{GSF}$ of the flipped gate transistor $M_{FGD}$, the first input voltage $V_1$ is less than the second input voltage $V_2$ and the flipped gate transistor $M_{FGD}$ turns off. The input to the inverter buffer INV1 becomes approximately the voltage level of the power supply voltage source $V_{dd}$ and the output of the inverter buffer INV1 becomes deactivated to a logical 0.

The threshold voltage $V_{TH}$ is the voltage level of the first input voltage $V_1$ at which the flipped gate transistor $M_{FGD}$ is turned on or turned on indicating the relative amplitudes of the first input voltage $V_1$ and the second input $V_2$. The voltage level of the threshold voltage $V_{TH}$ is determined according to the equation (3) as:

$$V_{TH} = \left(\frac{R_2}{R_1}\right)(V_2 - V_{GSF}) + V_{GSN} \quad (3)$$

Where:
$V_{TH}$ is the voltage at which the first input voltage $V_1$ is set to cause the comparison with the second input voltage $V_2$ to switch the comparison circuit to state;
$R_1$ is the value of the resistance of the resistor $R_1$ to set the conversion current $I_1$;
$R_2$ is the value of the resistance of the resistor $R_2$ for scaling the first input voltage $V_1$ to be scaled to the bandgap voltage;
$V_{GSF}$ is the gate to source voltage of the flipped gate transistor $M_{FGD}$;
$V_{GSN}$ is the gate to source voltage of the normally gated transistor $M_{FGN}$.

In FIG. 4b, the comparison circuit is structured as shown above for FIG. 4a with the addition of a hysteresis controller HYC. The hysteresis controller HYC has a third resistor $R_3$ that is placed between the second resistor $R_2$ and the first input voltage $V_1$ such that a first terminal of the third resistor $R_3$ is connected to the first input voltage $V_1$ and a second terminal of the third resistor is connected to the first terminal of the second resistor $R_2$. The hysteresis controller HYC has a hysteresis control PMOS transistor $M_{P2}$ with a source connected to the power supply voltage source $V_{dd}$ and drain connected to the junction of the connection between third resistor $R_3$ and the second resistor $R_2$. The gate of the hysteresis control PMOS transistor $M_{P2}$ is connected to the junction of the reference current source $I_{REF}$ and the drain of the flipped gate transistor $M_{FGD}$. When the flipped gate transistor $M_{FGD}$ is turned off, indicating that the first input voltage $V_1$ is less than the second input voltage $V_2$ and the output of the inverter buffer INV1 is set to the logical 0. The hysteresis control transistor $M_{P2}$ is also turned off. The threshold voltage $V_{TH}$ is the voltage level of the first input voltage $V_1$ at which the flipped gate transistor $M_{FGD}$ is turned on or turned on indicating the relative amplitudes of the first input voltage $V_1$ and the second input voltage $V_2$. The voltage level of the threshold voltage $V_{TH}$ is determined according to the equation (4) as:

$$V_{TH} = \left(\frac{R_2 + R_3}{R_1}\right)(V_2 - V_{GSF}) + V_{GSN} \quad (4)$$

Where:
$V_{TH}$ is the voltage at which the voltage $V_1$ set to cause the comparison with the voltage $V_2$ to switch the comparison circuit to state;
$R_1$ is the value of the resistance of the resistor $R_1$ to set the current $I_1$;
$R_2$ is the value of the resistance of the resistor $R_2$ for scaling the first input voltage $V_1$ to be scaled to the bandgap voltage;
$R_3$ is the value of the resistance of the resistor $R_3$ for scaling the first input voltage $V_1$ to be scaled to the bandgap voltage;
$V_{GSF}$ is the gate to source voltage of the flipped gate transistor $M_{FGD}$;
$V_{GSN}$ is the gate to source voltage of the normally gated transistor $M_{FGN}$.

When the flipped gate transistor $M_{FGD}$ is turned on, indicating that the first input voltage $V_1$ is greater than the second input voltage $V_2$ and the output of the inverter buffer INV1 is set to the logical 1. The hysteresis control transistor $M_{P2}$ is turned on to short out the resistor $R_3$. The threshold voltage $V_{TH}$ is then modified such that the voltage level of the first input voltage $V_1$ and the second input voltage $V_2$ at which the flipped gate transistor $M_{FGD}$ is turned on or turned off is modified as desired. The voltage level of the threshold voltage $V_{TH}$ is determined according to the equation (3) since the resistor $R_3$ is essentially removed from the circuit. In this case, the sum of the resistances of the second resistor $R_2$ and the third resistor $R_3$ is equal to the resistance of the resistor $R_1$ making the threshold voltage $V_{TH}$ more negative.

Figure 5:
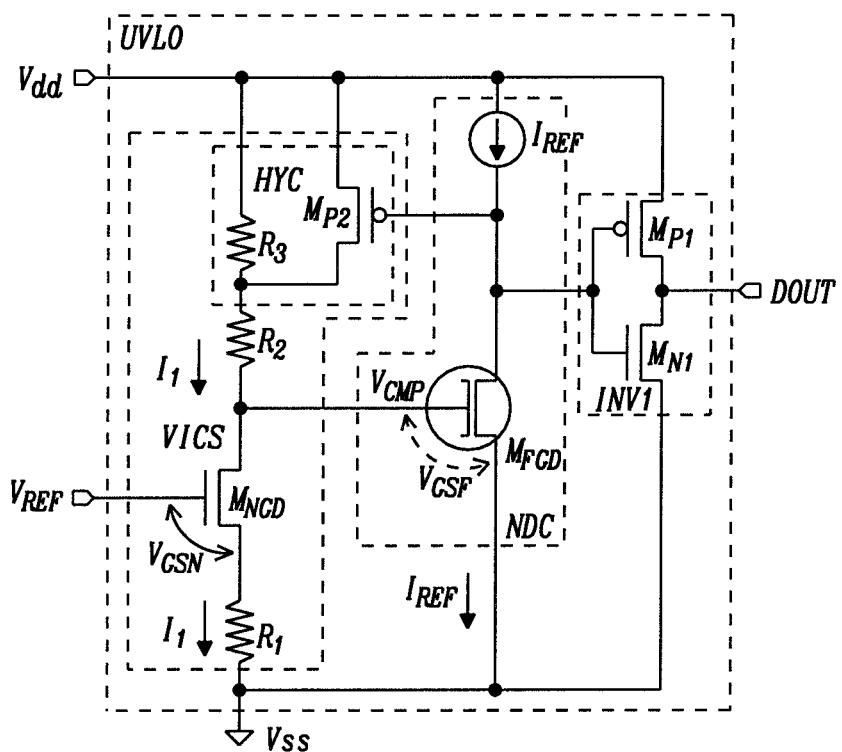
FIG. 5 is a schematic drawing of an implementation of a UVLO circuit embodying the principles of the present disclosure.

FIG. 5 is a schematic drawing of a basic implementation of an under-voltage lock out circuit UVLO embodying the principles of the present disclosure. The UVLO circuit is configured for enabling an electronic device, when a power supply voltage source $V_{dd}$ is at a voltage level that permits the operation of the electronic device, or disabling the electronic device, when the power supply voltage source is at a voltage level that prevents the operation of the electronic device. The UVLO circuit has a non-differential comparator NDC that includes a flipped gate transistor $M_{FGD}$ and a reference current source $I_{REF}$. The reference current source $I_{REF}$ has a first terminal connected to a power supply voltage source $V_{dd}$ and a second terminal connected to a drain of the flipped gate transistor $M_{FGD}$. The source of the flipped gate transistor $M_{FGD}$ is connected to a ground reference voltage source $V_{ss}$.

The UVLO Circuit has a voltage divider/converter VIC that is connected to the non-differential comparator NDC. The voltage divider/converter VIC has a normally gated transistor $M_{NGD}$ where the gate of the flipped gate transistor $M_{FGD}$ is connected to a drain of a normally gated transistor $M_{NGD}$. The voltage divider/converter VIC has a first resistor $R1_2$ and a second resistor $R_2$. A first terminal of the first resistor $R_1$ is connected to the power supply voltage source $V_{dd}$. The second terminal of the first resistor $R_1$ is connected to the first terminal of the second resistor $R_2$. The second terminal of the second resistor $R_2$ is connected to a gate of the flipped gate transistor $M_{FGD}$ and to the drain of the normally gated transistor $M_{NGD}$. The gate of the normally gated transistor $M_{NGD}$ is connected to receive a reference voltage $V_{REF}$. The source of the normally gated transistor $M_{NGD}$ is connected to a first terminal of a first resistor and a second terminal of the first resistor is connected to the ground reference voltage source $V_{SS}$. A voltage to current converter is formed by the normally gated transistor $M_{NGD}$ and the first resistor $R_1$. The voltage to current converter creates a conversion current $I_1$ that is proportional to the reference voltage $V_{REF}$.

The UVLO Circuit further has an inverter buffer INV1 having an input connected to common connection of the drain of the flipped gate transistor $M_{FGD}$ and the second terminal of the reference current source $I_{REF}$. The output of the inverter buffer INV1 is connected to external circuitry for enabling and disabling the electronic device. The inverter buffer INV1 has a PMOS transistor $M_{P1}$ and NMOS transistor $M_{N1}$. The source of the PMOS transistor PMOS transistor $M_{P1}$ is connected to the power supply voltage source $V_{dd}$. The drain of the PMOS transistor $M_{P1}$ is connected to the drain of the NMOS transistor $M_{N1}$ and to the output DOUT of the inverter buffer INV1. The source of the NMOS transistor $M_{N1}$ is connected to the ground reference voltage source $V_{SS}$. The gates of the PMOS transistor $M_{P1}$ and NMOS transistor $M_{N1}$ are connected and connected to the input of the inverter buffer INV1.

The conversion current $I_1$ flows through the second and third resistors $R_2$ and $R_3$ to establish a compare voltage $V_{CMP}$ at the gate of the flipped gate transistor $M_{FGD}$. When the compare voltage $V_{CMP}$ at the gate of the flipped gate transistor $M_{FGD}$ is greater than the threshold voltage $V_{GSF}$ of the flipped gate transistor $M_{FGD}$, the amplitude of the power supply voltage source $V_{dd}$ is greater than the raising threshold voltage $V_{THR}$ and the flipped gate transistor $M_{FGD}$ turns on. The input to the inverter buffer INV1 becomes approximately the voltage level of the ground reference voltage source $V_{SS}$ and the output of the inverter buffer INV1 becomes activated to a logical 1. The electrical device is activated to be fully functional. When the compare voltage $V_{CMP}$ at the gate of the flipped gate transistor $M_{FGD}$ becomes is less than the threshold voltage $V_{GSF}$ of the flipped gate transistor $M_{FGD}$, the voltage level of the power supply voltage source $V_{dd}$ is less than the falling threshold $V_{THF}$ and the flipped gate transistor $M_{FGD}$ turns off. The input to the inverter buffer INV1 becomes approximately the voltage level of the power supply voltage source $V_{dd}$ and the output of the inverter buffer INV1 becomes deactivated to a logical 0. The electrical device is deactivated to be turned off.

The UVLO Circuit has a hysteresis controller HYC that includes the third resistor $R_3$ and a hysteresis control PMOS transistor $M_{P2}$. A source of the hysteresis control PMOS transistor $M_{P2}$ is connected to the power supply voltage source $V_{dd}$ and a drain of the hysteresis control PMOS transistor $M_{P2}$ is connected to the junction of the connection between third resistor $R_3$ and the second resistor $R_3$. The gate of the hysteresis control PMOS transistor $M_{P2}$ is connected to the junction of the reference current source $I_{REF}$ and the drain of the flipped gate transistor $M_{FGD}$. When the flipped gate transistor $M_{FGD}$ is turned off, indicating that the voltage level of the power supply voltage source $V_{dd}$ is less than the rising threshold voltage level $V_{THR}$, the hysteresis control transistor $M_{P2}$ is also turned off and the compare voltage $V_{CMP}$ for indicating that the amplitude of the power supply voltage source $V_{dd}$ is less than the rising threshold voltage level $V_{THR}$ and the output of the inverter buffer INV1 is set to the logical 0 and the electronic device is turned off.

When the voltage level of the power supply voltage source $V_{dd}$ is greater than the rising threshold voltage level $V_{THR}$, the flipped gate transistor $M_{FGD}$ is turned on, output of the inverter buffer INV1 is activated to a logical 1 and the electronic device is turned on. At the same time, the hysteresis control transistor $M_{P2}$ is also turned on. This effectively shorts out the third resistor $R_3$ and changes the threshold voltage level of the power supply voltage source $V_{dd}$ to be the falling threshold voltage level $V_{THF}$. Thus, when the power supply voltage source $V_{dd}$ is less than the falling threshold voltage level $V_{THF}$, the flipped gate transistor $M_{FGD}$ is turned off to set the output of the inverter buffer to a logical 0 for turning off the electronic device. When the flipped gate transistor $M_{FGD}$ turns off, the hysteresis control transistor $M_{P2}$ is also turns off. The third resistor is restored to the voltage divider and the rising threshold voltage $V_{THR}$ is restored. As long as the voltage level of the power supply voltage source $V_{dd}$ is less than the rising threshold voltage $V_{THR}$, the flipped gate transistor $M_{FGD}$ is turned off, the output DOUT of the inverter buffer INV1 is at the logical 0, and the electronic device is turned off. When the voltage level of the power supply voltage source $V_{dd}$ is greater than the rising threshold voltage $V_{THR}$, the flipped gate transistor $M_{FGD}$ is turned on, the output DOUT of the inverter buffer INV1 is at the logical 1, and the electronic device is turned on. The cycle of operation is completed.

Figure 6A:
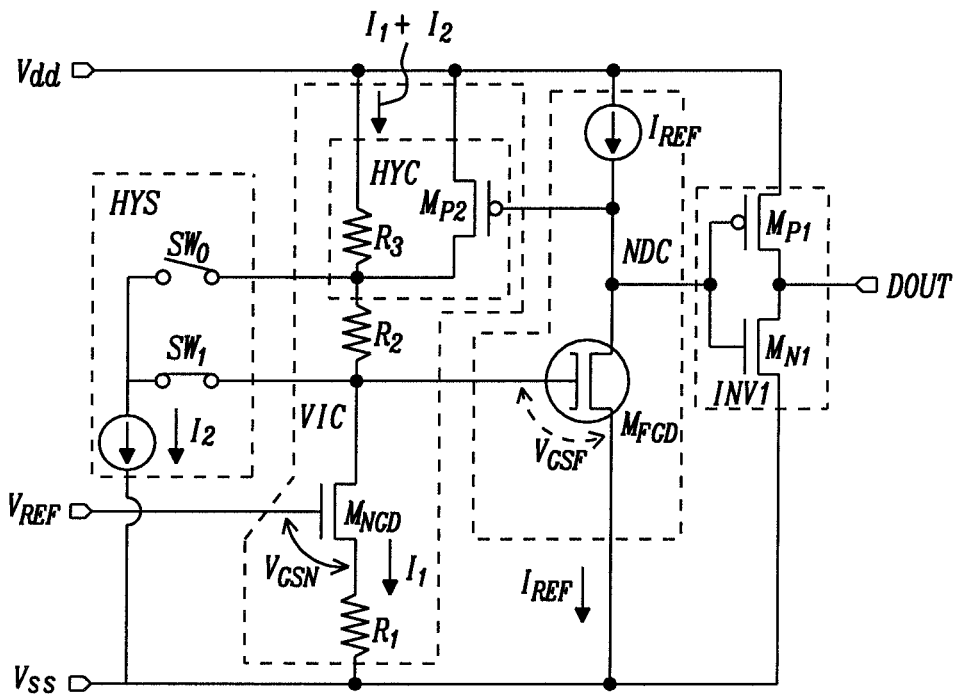
FIG. 6a is a schematic drawing of a second implementation of a UVLO circuit embodying the principles of the present disclosure.
Figure 6B:
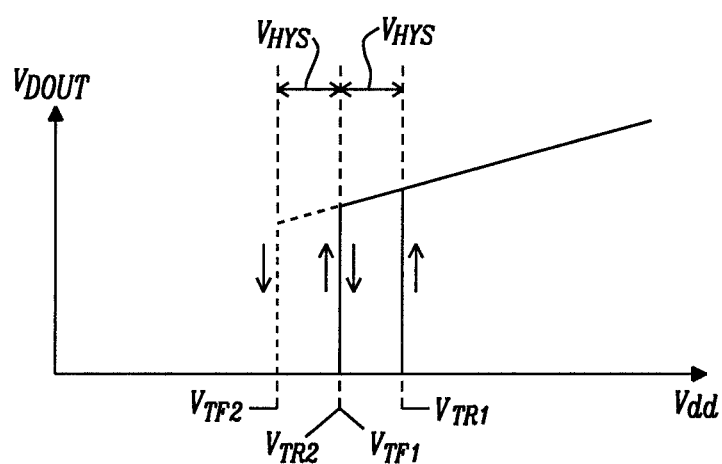
FIG. 6b is a plot of the output voltage of the UVLO circuit FIG. 6a versus the voltage level of a power supply voltage source.

FIG. 6a is a schematic drawing of a second implementation of a UVLO circuit embodying the principles of the present disclosure having selectable rising threshold voltages $V_{THR1}$ and $V_{THR2}$ and falling threshold voltages $V_{THF1}$ and $V_{THF2}$. FIG. 6b is a plot of the output voltage of the UVLO circuit FIG. 6a versus the voltage level of a power supply voltage source $V_{dd}$. The basic structure of the second implementation of the UVLO circuit is the same as the implementation of the UVLO circuit of FIG. 5. The voltage divider/current converter VIC, the non-differential comparator NDC, and the inverter buffer INV1 are configured identically. The addition of the selector circuit HSEL is added to the UVLO circuit of FIG. 5 provide for selecting one of two threshold pairs $V_{THR1}$ and $V_{THF1}$ and $V_{THR2}$ and $V_{THF2}$. The selector circuit includes the switches $SW_0$ and $SW_1$ and the biasing current source $I_2$. The switch $SW_0$ has a first pole connected to the junction of the resistor $R_2$ and the resistor $R_3$ and a second pole connected to a first terminal of the biasing current source $I_2$. The switch $SW_1$ has a first pole connected to the junction of the resistor $R_2$, the gate of the flipped gate transistor $M_{FGD}$, and the drain of the normally gated transistor $M_{NGD}$ and a second pole connected to a first terminal of the biasing current source $I_2$. The switches $SW_0$ and $SW_1$ each have a control terminal that is connected to a control circuit (not shown) that selects to activate one of the switches $SW_0$ and $SW_1$ at any given time or what is commonly called a "one-hot" operation.

The current consumed by the UVLO circuit of this implementation is increased by the amplitude of the biasing current source $I_2$. Refer now to FIG. 6b. When the UVLO circuit is initially activated the switch $SW_0$ is closed and $SW_1$ is normally open. The voltage drop across the resistor $R_3$ is determined by resistance of the resistor $R_3$ multiplied by the sum of the conversion current $I_1$ and the current $I_2$ ($I_1+I_2$). The thresholds are then set to the rising threshold voltage $V_{THR1}$ and falling threshold voltages $V_{THF1}$. When the switch $SW_0$ is opened and $SW_1$ is closed, the voltage drop across the resistor $R_3$ and the resistor $R_2$ is sum of the resistances of the resistors $R_2$ and $R_3$ ($R_2+R_3$) multiplied by the sum of the conversion current $I_1$ and the current $I_2$ ($I_1+I_2$). The thresholds are then set to the rising threshold voltage $V_{THR2}$ and falling threshold voltages $V_{THF2}$.

The hysteresis shift of the rising threshold voltages $V_{THR1}$ and $V_{THR2}$ to the falling threshold voltages $V_{THF1}$ and $V_{THF2}$ is controlled, as described above, by the activation and deactivation of the hysteresis control PMOS transistor $M_{P2}$. The voltage shift in the threshold voltage from the first threshold voltage pair $V_{THR1}$ and $V_{THF1}$ to the second threshold voltage pair $V_{THR2}$ and $V_{THF2}$ is determined by the resistance of the resistor $R_2$ multiplied by the current $I_2$ ($R_2*I_2$).

Figure 7:
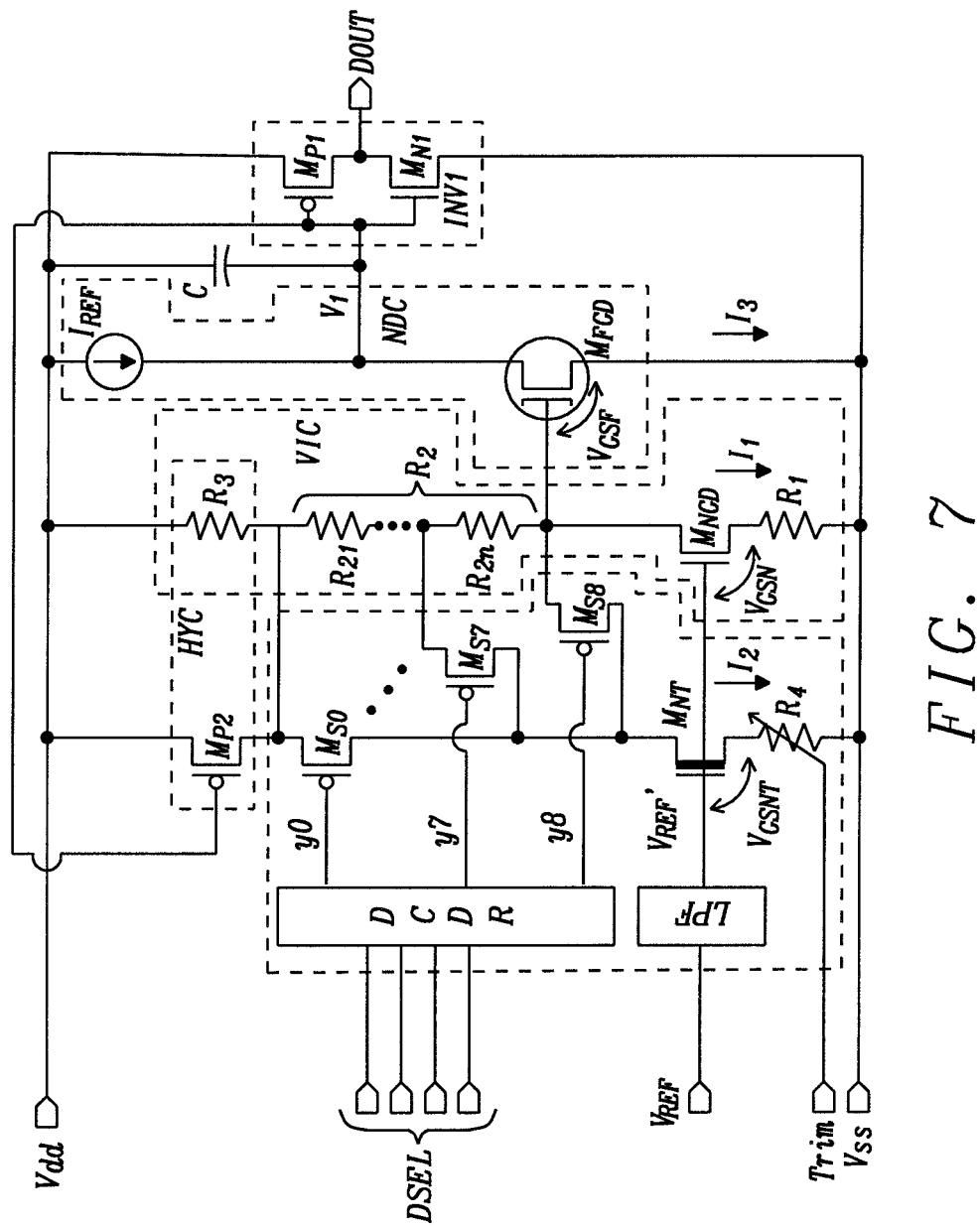
FIG. 7 is a schematic drawing of a third implementation of a UVLO circuit embodying the principles of the present disclosure.

FIG. 7 is a schematic drawing of a third implementation of a UVLO circuit embodying the principles of the present disclosure. It will be apparent to those skilled in the art, that the functionality of FIG. 6a will be improved by adding more switches and taps on resistor $R_2$ to give fine step selection of the threshold values of the power supply voltage source $V_{dd}$ at which the UVLO circuit is triggered while maintaining the same current consumption. Referring to FIG. 7, the non-differential comparator NDC, and the inverter buffer INV1 are configured identically to those of FIG. 5. The capacitor C is placed such that the first terminal of the capacitor C is connected to power supply voltage source $V_{dd}$ and the common connection of the second terminal of the reference current source $I_{REF}$, the drain of the flipped gate transistor $M_{FGD}$, and the input of the inverter buffer INV1. The purpose of the capacitor C is added such that the output DOUT of the inverter buffer INV1 is held at a the logical 0 for guaranteeing a proper reset period when the electronic device is connected to the power supply voltage source.

The voltage divider/current converter VIC is essentially identical to the voltage divider/current converter VIC of FIG. 6a except the resistor $R_2$ is composed of multiple serially connected resistors $R_{21}, \ldots, R_{2n}$. The connection between each of the multiple serially connected resistors $R_{21}, \ldots, R_{2n}$ is the tap of the resistor $R_2$ that connects to the multiple switch transistors $M_{S0}, \ldots, M_{S7}$, and $M_{S8}$ for providing the fine step selection of the threshold values of the power supply voltage source $V_{dd}$ at which the UVLO circuit is triggered. As described in FIG. 6a, the first switch transistor $M_{S0}$ has a source connected to the junction of the resistor $R_{21}$ and the resistor $R_3$. The source of last select transistor $M_{S8}$ is connected to the junction of the last resistor $R_{2n}$, the gate of the flipped gate transistor $M_{FGD}$, and the drain of the normally gated transistor $M_{NGD}$. The remaining select transistors as illustrated by the select transistor $M_{S7}$ have their sources connected to the junctions of the serially connected resistors.

The drains of the multiple switch transistors $M_{S0}, \ldots, M_{S7}$, and $M_{S8}$ are connected together and to the drain of the native transistor $M_{NT}$. As is known in the art, the native transistor $M_{NT}$ is a MOS field-effect transistor that functions between enhancement and depletion modes. The native transistor $M_{NT}$ is formed using the only natural thin oxide film formed over the silicon substrate during processing of other layers and has a threshold voltage $V_{GSNT}$ that is nearly zero volts.

The source of the native transistor $M_{NT}$ is connected to a first terminal of an trimmable resistor $R_4$. The second terminal of an trimmable resistor $R_4$ is connected to the ground reference voltage source $V_{SS}$. The reference voltage $V_{REF}$ terminal is connected to the low pass filter LPF. The output of the low pass filter LPF is a filtered reference voltage $V_{REF}'$ that is transferred to the gate of the native transistor $M_{NT}$. The native transistor $M_{NT}$ and the trimmable resistor $R_4$ form a constant biasing current source that sources the biasing current $I_2$. The biasing current $I_2$ is determined by the equation:

$$I_2 = (V_{REF}' - V_{GSNT})R_4$$

Where:

$V_{GSNT}$ is the gate to source voltage of the native transistor $M_{NT}$.

As noted the above, the gate to source voltage of the native transistor $M_{NT}$ is approximately zero volts. Thus, the biasing current $I_2$ is approximately equal to the product of the reference voltage $V_{REF}$ and the biasing resistor $R_4$.

In operation, one of the multiple switch transistors $M_{S0}, \ldots, M_{S7}$, and $M_{S8}$ is turned on to set the falling threshold voltage level $V_{THF}$ where output of the inverter buffer INV1 toggles between the logical 0 to the logical 1. The hysteresis control circuit HYS determines the width of the hysteresis voltage $V_{HYS}$ (as shown in FIG. 6a) by the activation and deactivation of the hysteresis control PMOS transistor $M_{P2}$. The hysteresis control PMOS transistor $M_{P2}$ has a source connected to the power supply voltage source $V_{dd}$ and drain connected to the junction of the connection between third resistor $R_3$ and the second resistor $R_2$. The gate of the hysteresis control PMOS transistor $M_{P2}$ is connected to the junction of the reference current source $I_{REF}$ and the drain of the flipped gate transistor $M_{FGD}$. When the flipped gate transistor $M_{FGD}$ is turned off, indicating that the power supply voltage source $V_{dd}$ is less than the falling threshold voltage $V_{THF}$ and the output of the inverter buffer INV1 is set to the logical 0. The hysteresis control transistor $M_{P2}$ is also turned off and the resistor $R_3$ is in series with the multiple serially connected resistors $R_{21}, \ldots, R_{2n}$ that form the resistor $R_2$. When the flipped gate transistor $M_{FGD}$ is turned on, indicating that the power supply voltage source $V_{dd}$ is greater than raising threshold voltage $V_{THR}$ and the output of the inverter buffer INV1 is set to the logical 1. The hysteresis control transistor $M_{P2}$ is also turned on and the resistor $R_3$ is essentially out from being in series with the multiple serially connected resistors $R_{21}, \ldots, R_{2n}$ that form the resistor $R_2$.

The selection of which of the multiple serially connected resistors $R_{21}, \ldots, R_{2n}$ that current $I_2$ flows as determined by activation of the one of the multiple switch transistors $M_{S0}, \ldots, M_{S7}$, and $M_{S8}$ determines the location of the falling threshold voltage level $V_{THF}$ and the voltage at which the power supply voltage source $V_{dd}$ is sufficient for turning on or turning off the electronic device. During operations, the sum of the resistances of the resistors $R_2$ and $R_3$ is equal the resistance of the resistor $R_1$. The bandgap voltage $V_{BANDGAP}$ is determined as the difference of the gate-to-source threshold voltages $V_{GSF}$ and $V_{GSN}$ of the flipped gate transistor $M_{FGD}$ and to the drain of the normally gated transistor $M_{NGD}$ as shown by the equations:

$$R_1 = R_3 + R_2$$

$$V_{BANDGAP} = V_{GSF} - V_{GSN}.$$

The selection of the switches is determined by the following:

$$M_{S0} \text{ is ON: } V_{thr} = V\text{ref} + V\text{bandgap} + I_2 * R3.$$

$$M_{S1} \text{ is ON: } V_{thr} = V\text{ref} + V\text{bandgap} + I_2 * (R_3 + R_{21})$$

$$M_{S2} \text{ is ON: } V_{thr} = V\text{ref} + V\text{bandgap} + I_2 * (R_3 + R_{21} + R_{22})$$

. . .

$$M_{S8} \text{ is ON: } V_{thr} = V\text{ref} + V\text{bandgap} + I_2 * (R_3 + R_{21} + \ldots + R_{28})$$

$$M_{SX} \text{ is ON: } V_{thf} = V_{thr} - V_{HYS}$$

$$V_{HYS} = R_3 * (I_2 + (V_{REF} - V_{GSN})/R_1)$$

Where:
$M_{S0}, \ldots, M_{S7}$, and $M_S$ are the multiple switch transistors;
$V_{THR}$ is the rising threshold voltage level setting;
$V_{THF}$ is the falling threshold voltage level setting;
$V_{REF}$ is the reference voltage;
VGSN is the gate-to-source threshold voltage.

Figure 8:
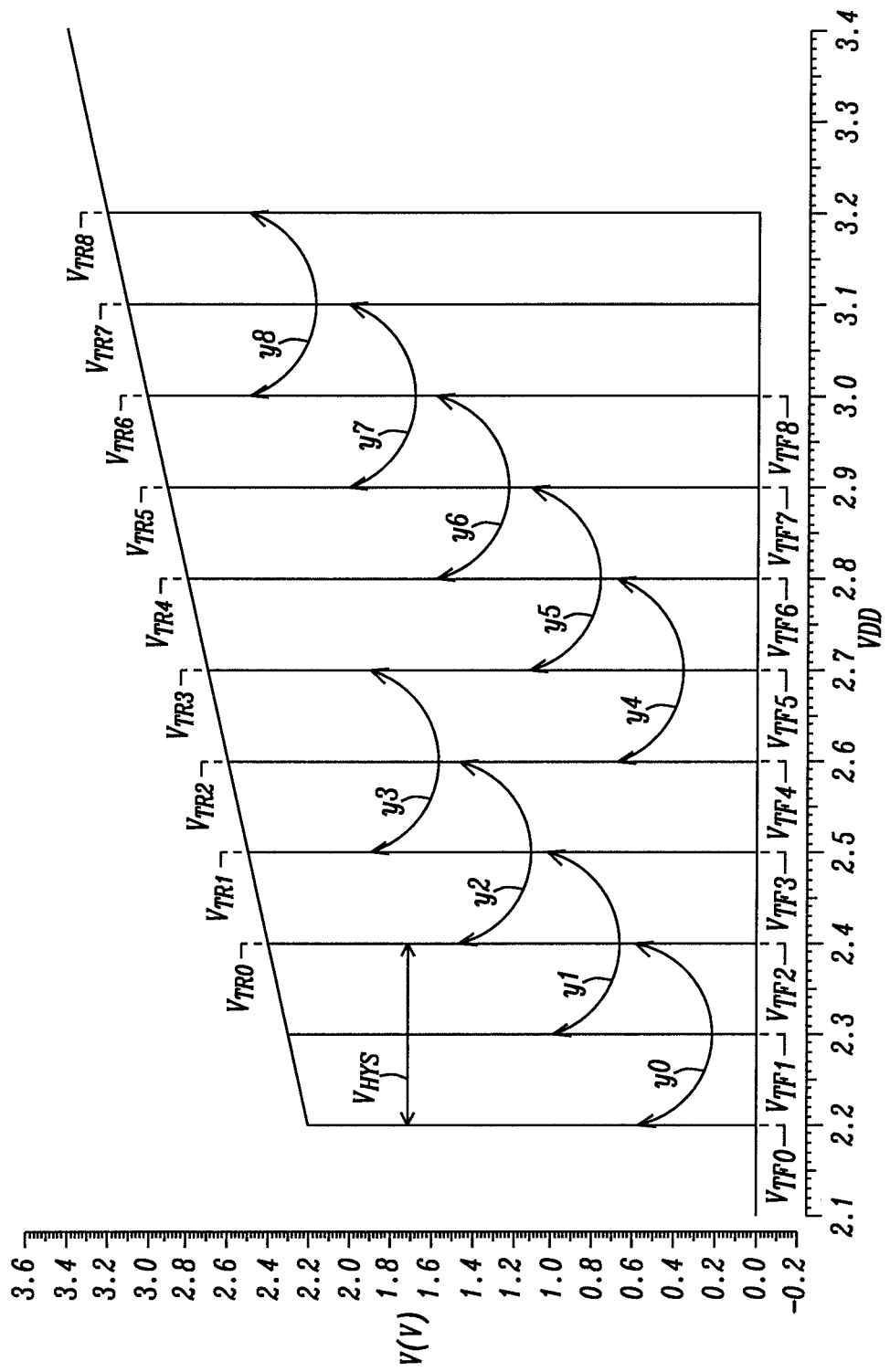
FIG. 8 is a plot of simulations of the third implementation of a UVLO circuit of FIG. 7 showing the output voltage of the UVLO circuit of FIG. 7 versus the voltage level of the power supply voltage for nine different threshold voltage level settings.

FIG. 8 is a plot of simulations of the third implementation of a UVLO circuit of FIG. 7 showing the output voltage of the UVLO circuit of FIG. 7 versus the voltage level of the power supply voltage source $V_{dd}$ for nine different falling threshold voltage level settings $V_{THF0}, \ldots, V_{THF0}$. Each gate of the multiple switch transistors $M_{S0}, \ldots, M_{S7}$, and $M_{S8}$ is connected to the output y0, . . . , y7, and y8 of the decoder circuit DCDR. The decoder circuit DCDR receives the decode select word DSEL that determines which output y0, . . . , y7, and y8 of the decoder circuit DCDR is activated to turn on one of the multiple switch transistors $M_{S0}, \ldots, M_{S7}$, and $M_{S8}$ for determining one of the falling threshold voltage level settings $V_{THF0}, \ldots, V_{THF0}$. The settings y0, . . . , y7, and y8 of the decoder circuit DCDR activate one of the multiple serially connected resistors $R_{21}, \ldots, R_{2n}$ that form the resistor $R_2$ to establish the path through the resistor $R_3$ and the multiple serially connected resistors $R_{21}, \ldots, R_{2n}$ that determine the deactivation level of the falling threshold voltage level settings $V_{THF0}, \ldots, V_{THF0}$ and the activation level of the raising threshold voltage level settings $V_{THR0}, \ldots, V_{THr0}$ for turning off the electronic device or turning on the electronic device.

Figure 9:
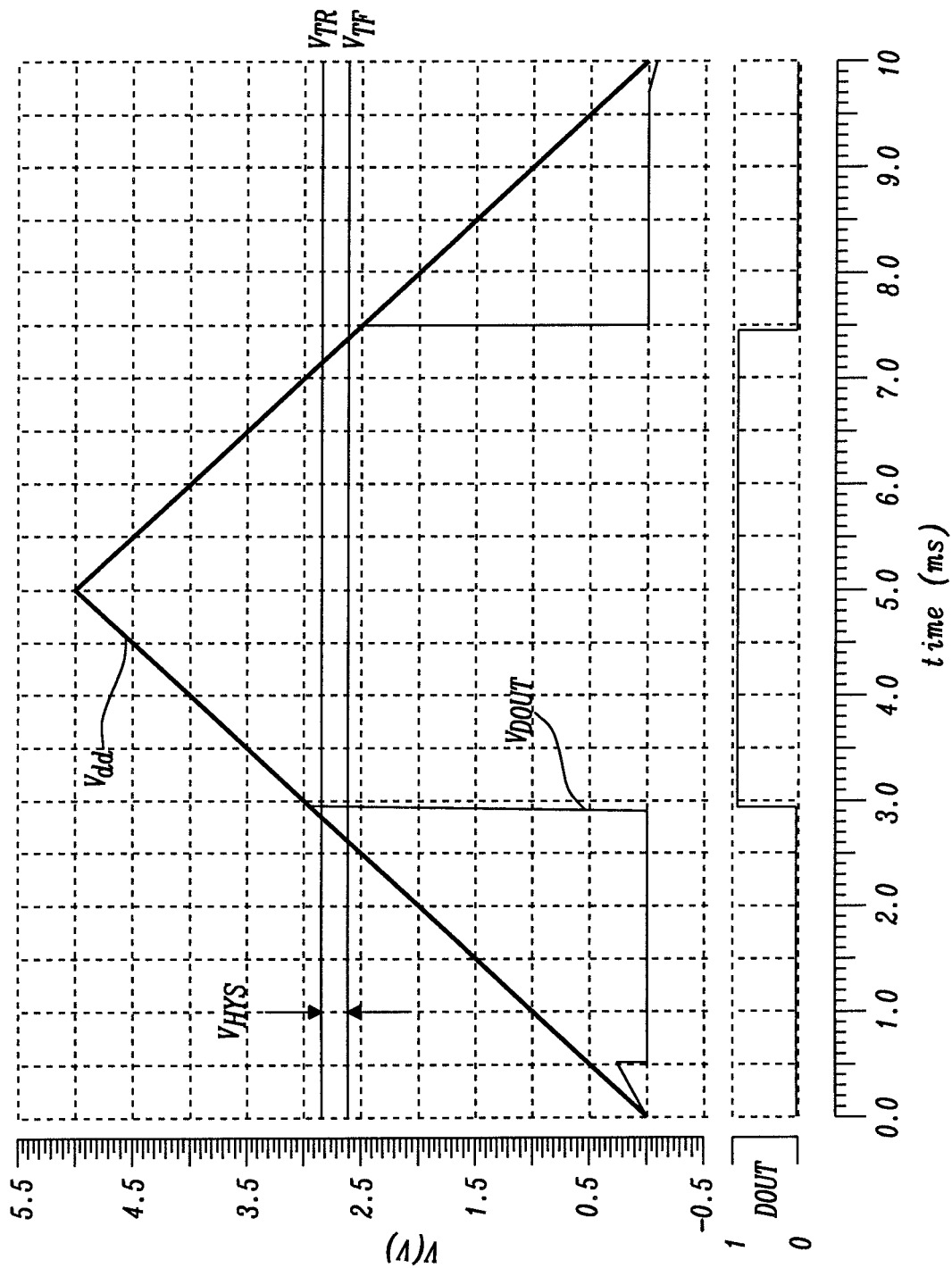
FIG. 9 is a plot of simulations of the third implementation of a UVLO circuit of FIG. 7 showing the transient response of the UVLO circuit of FIG. 7 over time.

FIG. 9 is a plot of simulations of the third implementation of a UVLO circuit of FIG. 6a showing the transient response of the UVLO circuit of FIG. 6a over time. The power supply voltage source $V_{dd}$ raises from a 0V level at the time 0.0 ms to the voltage level of raising threshold voltage level $V_{THR}$ at the time 2.8 ms. At that time, the voltage at the gate of the flipped gate transistor $M_{FGD}$ reaches the threshold voltage $V_{GSF}$ of the flipped gate transistor $M_{FGD}$. The flipped gate transistor $M_{FGD}$ is turned on and the output DOUT of the inverter INV1 changes from the logical 0 to the logical 1 and the voltage $V_{DOUT}$ raises to the voltage of approximately 2.6V or approximately the voltage level of the power supply voltage source $V_{dd}$. With the output of the output DOUT of the inverter INV1 being at the logical 1, the electronic device is activated.

At the time 5.0 ms, the power supply voltage source $V_{dd}$ begins to fall from its maximum voltage of 4.75V to the voltage level of falling threshold voltage level $V_{THF}$ at the time 7.5 ms. At that time, the voltage at the gate of the flipped gate transistor $M_{FGD}$ reaches the threshold voltage $V_{GSF}$ of the flipped gate transistor $M_{FGD}$. The flipped gate transistor $M_{FGD}$ is turned off and the output DOUT of the inverter INV1 changes from the logical 1 to the logical 0 and the voltage $V_{DOUT}$ falls to the voltage of approximately 0V or approximately the voltage level of the ground reference voltage source $V_{ss}$. With the output of the output DOUT of the inverter INV1 being at the logical 0, the electronic device is deactivated. The power supply voltage source $V_{dd}$ continues to fall until the power supply voltage source $V_{dd}$ is at the 0V level.

Figure 10:
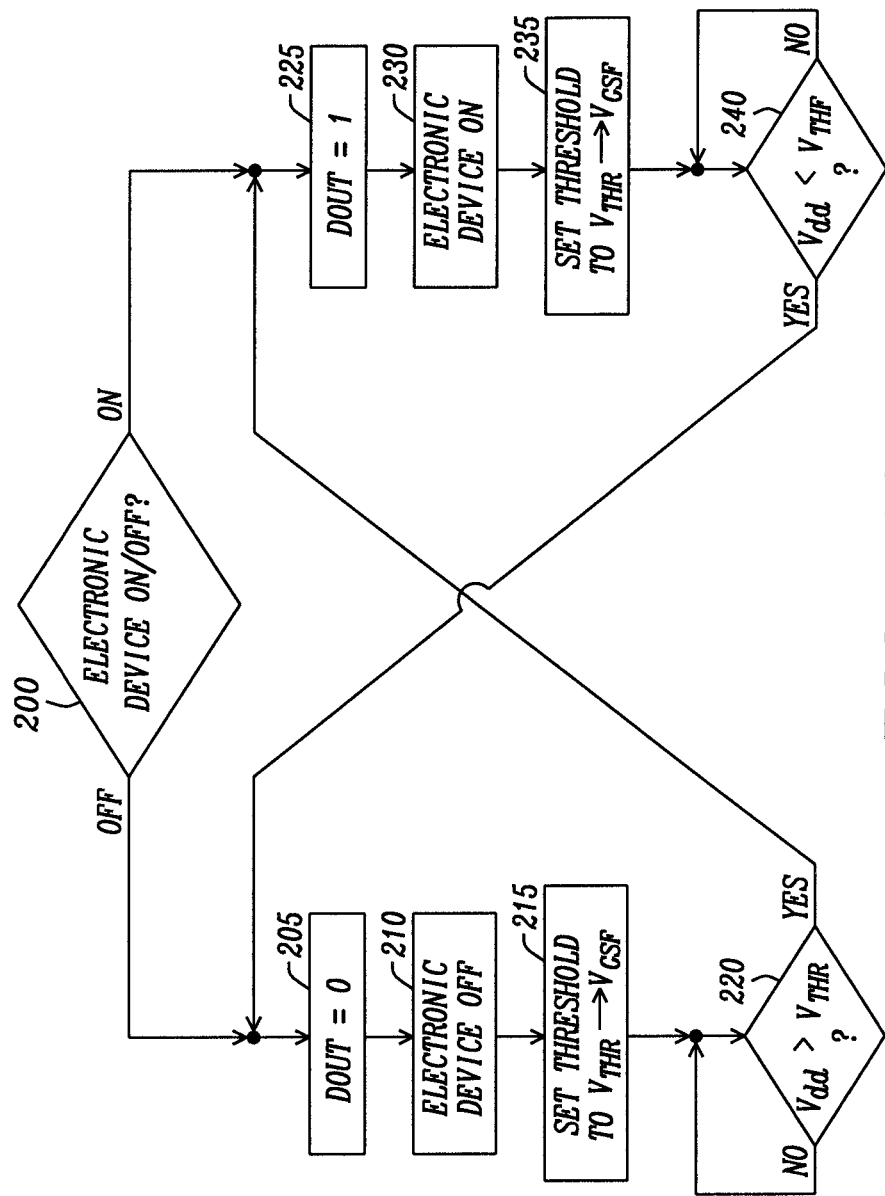
FIG. 10 is a flow chart illustrating the operation of UVLO embodying the principles of the present disclosure.

FIG. 10 is a flow chart illustrating the operation of UVLO embodying the principles of the present disclosure. Referring to FIGS. 5 and 10, when an electronic device is totally deactivated, the power supply voltage source $V_{dd}$ is at the 0V level and the UVLO circuit is not functional. Once the power supply voltage source $V_{dd}$ begins to power up from the 0V level the electronic device will be turned off. Alternately, if the electronic device is turned on, the power supply voltage source $V_{dd}$ is activated and the electronic device is turned on. In the method of operation, the state of the electronic device is determined (Box 200). If the electronic device is not activated or turned off, the power supply voltage source $V_{dd}$, the UVLO circuit is also deactivated and the output of the inverter buffer INV1 set (Box 205) to the logical 0 and the electronic device is (Box 210) turned off. The threshold voltage level of the power supply voltage source $V_{dd}$ is set (Box 215) to the raising threshold voltage level $V_{THR}$. The raising threshold voltage level $V_{THR}$ is the voltage level of the power supply voltage source $V_{dd}$ at the input of the UVLO circuit. The voltage divider/current converter VIC is configured such that the voltage at the gate of the flipped gate transistor $M_{FGD}$ is the threshold voltage $V_{GSF}$ of the flipped gate transistor $M_{FGD}$ when the voltage level of the power supply voltage source $V_{dd}$ is at the raising threshold voltage level $V_{THR}$. The voltage level of the power supply voltage source $V_{dd}$ is compared (Box 220) with the raising threshold voltage level $V_{THR}$. If the voltage level of the power supply voltage source $V_{dd}$ is less than the raising threshold voltage level $V_{THR}$, the comparison (Box 220) continues.

When the power supply voltage source $V_{dd}$ is becomes greater than the raising threshold voltage level $V_{THR}$, the voltage level at the gate of the flipped gate transistor $M_{FGD}$ is greater than its threshold voltage level $V_{GSF}$ and the flipped gate transistor $M_{FGD}$ is turned on and the output of the inverter buffer INV1 is activated (Box 225) to the logical 1 and the electronic device is turned on (Box 230). The threshold voltage level of the power supply voltage source $V_{dd}$ is set (Box 235) to the falling threshold voltage level $V_{THF}$. The falling threshold voltage level $V_{THF}$ is the voltage level of the power supply voltage source $V_{dd}$ at the input of the UVLO circuit. The voltage divider/current converter VIC is configured such that the voltage at the gate of the flipped gate transistor $M_{FGD}$ is the threshold voltage $V_{GSF}$ of the flipped gate transistor $M_{FGD}$ when the voltage level of the power supply voltage source $V_{dd}$ is at the falling threshold voltage level $V_{THF}$.

The voltage level of the power supply voltage source $V_{dd}$ is compared (Box 240) with the falling threshold voltage level $V_{THFR}$. If the voltage level of the power supply voltage source $V_{dd}$ is greater than the falling threshold voltage level $V_{THF}$, the comparison (Box 240) continues.

When the power supply voltage source $V_{dd}$ is becomes less than the falling threshold voltage level $V_{THF}$, the first voltage level at the gate of the flipped gate transistor $M_{FGD}$ is less than its threshold voltage level $V_{GSF}$ and the flipped gate transistor $M_{FGD}$ is turned off and the output of the inverter buffer INV1 is deactivated (Box 205) to the logical 0 and the electronic device is turned on (Box 210). The process then continues until the power supply voltage source $V_{dd}$ is totally deactivated and there is 0V and the whole electronic device is turned off.

While this disclosure has been particularly shown and described with reference to the preferred embodiments thereof, it will be understood by those skilled in the art that various changes in form and details may be made without departing from the spirit and scope of the disclosure.

What is claimed is:

1. A comparison circuit is configured for receiving a first input voltage and a second input voltage and configured for comparing the first input voltage with the second input voltage and determining if a first input voltage is greater than or lesser than a threshold voltage between the first input voltage and the second input voltage, the comparison circuit comprising:
    a non-differential comparator configured for having a fixed threshold voltage at an input such that when a signal developed from the first and second input voltages is greater than the fixed threshold voltage, an output of the non-differential comparator is placed at a first voltage level and when the signal developed from the first and second input voltages is less than the fixed threshold voltage, an output of the non-differential comparator is placed at a second voltage level wherein the first and second voltage levels form a comparison output signal;
        wherein a flipped gate transistor is configured such that a gate-to-source threshold voltage is fixed threshold voltage; and
    a voltage divider having a first terminal connected to receive the first input voltage and a second terminal connected to receive the second input voltage and configured for dividing a difference in the first input voltage and the second input voltage such that a compare voltage is applied to the input of the non-differential comparator for comparison with the fixed threshold voltage.

2. The comparison circuit of claim 1 wherein the non-differential comparator comprises:
    the flipped gate transistor comprising:
        a gate configured to receive the signal developed from the first and second input voltages,
        a source connected to a reference terminal of a power supply voltage,
        a drain configured for providing the first and second voltage levels at the output of the comparison circuit; and
    a reference current source having a first terminal connected to the drain of the flipped gate transistor and a second terminal connected to a power terminal of the power supply voltage and configured for providing a reference current for the flipped gate transistor for developing the first and second voltage levels.

3. The comparison circuit of claim 2 wherein the voltage divider comprises:

a first resistor with a first terminal connected for receiving the first input voltage, and a second terminal connected to a gate of the flipped gate transistor;
a voltage to current converter connected to the junction of the connection between the second terminal of the first resistor and the gate of the flipped gate transistor, and configured for providing a conversion current that is proportional to an amplitude of the second input voltage;
wherein, the resistance of the first resistor, an amplitude of the first input voltage, an amplitude of the second input voltage determine the compare voltage applied to the gate of the flipped gate transistor for determining a voltage difference at which the flipped gate transistor will change from the first input voltage level to the second voltage level.

4. The comparison circuit of claim 3 wherein the voltage to current converter comprises:
    a normally gated transistor comprising:
        a drain connected to the gate of the flipped gate transistor and the second terminal of the first resistor,
        a gate connected to receive the second input voltage, and
        a source; and
    a second resistor having a first terminal connected to the source of the normally gated transistor and a second terminal connected to receive a ground reference voltage.

5. The comparison circuit of claim 4 further comprising:
    an inverter buffer having an input connected to the output of the non-differential comparator and an output connected to circuitry of an electronic device, and configured for receiving the first voltage level and the second voltage level from the non-differential comparator for inverting and buffering the comparison output signal.

6. The comparison circuit of claim 5 wherein the inverter buffer comprises:
    a transistor of a first conductivity type comprising:
        a source connected to the power supply voltage,
        a drain connected to the external circuitry, and
        a gate connected to the output of the non-differential comparator; and
    a transistor of a second conductivity type comprising:
        a source connected to the ground reference voltage,
        a drain connected to the drain of the transistor of the first conductivity and to the external circuitry, and
        a gate connected to the output of the non-differential comparator and to the gate of the transistor of the first conductivity.

7. The comparison circuit of claim 4 wherein the current flowing through the second resistor flows through the first resistor to establish the compare voltage at the gate of the flipped gate transistor, wherein the first resistor and the second resistor are approximately equal.

8. The comparison circuit of claim 4 wherein when the compare voltage at the gate of the flipped gate transistor is greater than the threshold voltage of the flipped gate transistor, the first input voltage and the second input voltage are at a voltage difference that the compare voltage will turn on the flipped gate transistor and the input to the inverter buffer becomes approximately the voltage level of the ground reference voltage and the output of the inverter buffer becomes activated to the second logical state.

9. The comparison circuit of claim 4 wherein the compare voltage at the gate of the flipped gate transistor becomes less than the threshold voltage of the flipped gate transistor, the first input voltage and the second input voltage are at a voltage difference that the compare voltage will turn off the flipped gate transistor and the input to the inverter buffer becomes approximately the voltage level of the power supply voltage and the output of the inverter buffer becomes deactivated to a first logical state.

10. The comparison circuit of claim 3 further comprising a hysteresis controller configured for adjusting the compare voltage such that if the first input voltage is less than the second input voltage, the voltage difference between the first input voltage and the second input is at a first input voltage level to make the compare voltage at the voltage level of the fixed threshold voltage and configured for adjusting the compare voltage such that if the first input voltage is greater than the second input voltage, the voltage difference between the first input voltage and the second input is at a second voltage level to make the compare voltage at the voltage level of the fixed threshold voltage to establish hysteresis between the first input voltage level and the second voltage level.

11. The comparison circuit of claim 10 wherein a hysteresis controller comprises:
   a third resistor that is placed between the second resistor and the power supply voltage such that a first terminal of the third resistor is connected to the power supply voltage and a second terminal of the third resistor is connected to the first terminal of the second resistor;
   a hysteresis control transistor comprising:
      a source connected to the power supply voltage,
      a drain connected to the junction of the connection between the third resistor and the second resistor, and
      a gate of the hysteresis control transistor connected to the junction of the reference current source and the drain of the flipped gate transistor,
      wherein when the flipped gate transistor is turned off, indicating that the first input voltage is less than the second input voltage, the hysteresis control transistor is also turned off and the first input voltage and the second input voltage are at a voltage difference for indicating that the first input voltage is less than the second input voltage and the output of the inverter buffer is set to the first logical state,
      wherein when the flipped gate transistor is turned on, the hysteresis control transistor is also turned on, effectively shorting out the third resistor for changing the threshold and the first input voltage and the second input voltage are at a voltage difference for indicating that the first input voltage is greater than the second input voltage and the output of the inverter buffer is set to the second logical state.

12. An under-voltage lockout (UVLO) circuit configured for enabling and disabling an electronic device, if a power supply voltage is at a voltage level that permits the operation of the electronic devices, wherein the UVLO circuit comprises:
   a non-differential comparator configured to have a fixed threshold voltage at an input such that when a signal developed from the power supply voltage and a reference voltage is greater than the fixed threshold voltage, an output of the non-differential comparator is placed at a first voltage level and when the signal developed from the power supply voltage and the reference voltage is less than the fixed threshold voltage, an output of the non-differential comparator is placed at a second voltage level, wherein the first and second voltage levels define a comparison output signal;
   a voltage divider having a first terminal connected to the power supply voltage and a second terminal connected to receive the reference voltage and configured for dividing a difference in the power supply voltage and the reference voltage such that a compare voltage is applied to the input of the non-differential comparator for comparison with the fixed threshold voltage; and
   a hysteresis controller configured for adjusting the compare voltage such that if the power supply voltage is less than a falling threshold voltage, the voltage difference between the power supply voltage and the reference voltage is at a first voltage level to make the compare voltage at the voltage level of the fixed threshold voltage and configured for adjusting the compare voltage such that if the power supply voltage is greater than a rising voltage, to make the compare voltage at the voltage level of the fixed threshold voltage to establish hysteresis between the first voltage level and the second voltage level.

13. The UVLO circuit of claim 12 wherein the non-differential comparator comprises:
   a flipped gate transistor comprising:
      a gate configured to receive the signal developed from the power supply voltage and the reference voltage,
      a source connected to a ground reference voltage,
      a drain configured for providing the first and second voltage levels at the output of the comparison circuit; and
      wherein the flipped gate transistor is configured such that a gate-to-source threshold voltage is the fixed threshold voltage; and
   a reference current source having a first terminal connected to the drain of the flipped gate transistor and a second terminal connected to a power terminal of the power supply voltage and configured for providing a reference current for the flipped gate transistor for developing the first and second voltage levels.

14. The UVLO circuit of claim 12 wherein the voltage divider comprises:
   a first resistor with a first terminal connected to receive the power supply voltage and a second terminal;
   a second resistor with a first terminal connected to the second terminal of the first resistor and a second terminal connected to a gate of the flipped gate transistor;
   a voltage to current converter connected for receiving the reference voltage, connected to the junction of the connection between the second terminal of the second resistor and the gate of the flipped gate transistor, and configured for providing a conversion current to the first and second resistors that is proportional to an amplitude of the reference voltage;
   wherein, the resistance of the first and second resistors, an amplitude of the power supply voltage, an amplitude of the reference voltage determine the compare voltage applied to the gate of the flipped gate transistor for determining a voltage difference at which the flipped gate transistor will change from the level of the power supply voltage to the level of the reference voltage.

15. The UVLO circuit of claim 14 the voltage to current converter comprises:
   a normally gated transistor comprising:
      a drain connected to the gate of the flipped gate transistor and the second terminal of the first resistor,
      a gate connected to reference voltage, and
      a source; and a third resistor having a first terminal connected to the source of the normally gated transistor and a second terminal connected to the ground reference voltage.

16. The UVLO circuit of claim 14 further comprising:
an inverter buffer having an input connected to the output of the non-differential comparator and an output connected to circuitry of an electronic device, and configured for receiving the first voltage level and the second voltage level from the non-differential comparator for inverting and buffering the comparison output signal to create the output signal of the UVLO circuit for transfer to the external circuitry indicating that the electronic device is turned on or turned off.

17. The UVLO circuit of claim 16 wherein the inverter buffer comprises:
an inverter has a transistor of the first conductivity comprising:
a source connected to the power supply voltage,
a drain connected to the external circuitry, and
a gate connected to the output of the non-differential comparator; and
a transistor of the second conductivity,
a source connected to the ground reference voltage,
a drain connected to the drain of the transistor of the first conductivity and to the external circuitry, and
a gate connected to the output of the non-differential comparator and to the gate of the transistor of the first conductivity.

18. The UVLO circuit of claim 15 wherein the current flowing through the third resistor flows through the first and second resistors to establish the compare voltage at the gate of the flipped gate transistor.

19. The UVLO circuit of claim 15 wherein when the compare voltage at the gate of the flipped gate transistor is greater than the gate to source threshold voltage of the flipped gate transistor, the power supply voltage the rising threshold voltage such that the compare voltage will turn on the flipped gate transistor and the input to the inverter buffer becomes approximately the voltage level of the ground reference voltage and the output of the inverter buffer becomes activated to the second logical state.

20. The UVLO circuit of claim 15 wherein when the compare voltage at the gate of the flipped gate transistor becomes is less than the gate to source threshold voltage of the flipped gate transistor, the power supply voltage is less than the falling threshold voltage such that the compare voltage will turn off the flipped gate transistor and the input to the inverter buffer becomes approximately the voltage level of the power supply voltage and the output of the inverter buffer becomes deactivated to a first logical state.

21. The UVLO circuit of claim 12 wherein the hysteresis controller comprises:
the third resistor that is placed between the second resistor and the power supply voltage;
a hysteresis control transistor comprising:
a source connected to the power supply voltage,
a drain connected to the junction of the connection between the third resistor and the second resistor, and
a gate of the hysteresis control transistor connected to the junction of the reference current source and the drain of the flipped gate transistor,
wherein when the flipped gate transistor is turned off, the hysteresis control transistor is also turned off and the power supply voltage has the falling threshold voltage, wherein when the flipped gate transistor is turned on, the hysteresis control transistor is also turned on, effectively shorting out the third resistor for changing the power supply voltage to have the rising threshold.

22. The UVLO circuit of claim 14 wherein when the compare voltage at the gate of the flipped gate transistor is greater than the gate to source threshold voltage of the flipped gate transistor, the amplitude of the power supply voltage is greater than the rising threshold and the flipped gate transistor turns on such that the comparison output signal is at the voltage level of the ground reference voltage and the output of the inverter buffer becomes activated to the second logical state, and the electrical device is activated to be fully functional.

23. The UVLO circuit of claim 14 wherein when the compare voltage at the gate of the flipped gate transistor becomes is less than the threshold voltage of the flipped gate transistor, the voltage level of the power supply voltage is less than the falling threshold voltage and the flipped gate transistor turns off such that the comparison output signal becomes approximately the voltage level of the power supply voltage and the output of the inverter buffer becomes deactivated to the first logical state, and the electrical device is deactivated to be turned off.

24. The UVLO circuit of claim 14 wherein the second resistor comprises by a plurality of serially connected resistors, wherein a first terminal of a first resistor of the multiple serially connected resistors is connected to the second terminal of the first resistor and a second terminal of a last resistor of the multiple serially connected resistors is connected to the junction of the gate of the flipped gate transistor and the drain of the normally gated transistor.

25. The UVLO circuit of claim 24 wherein when each junction of each of the terminals of the multiple serially connected resistors is connected to one switch of a plurality of single pole switches.

26. The UVLO circuit of claim 25 further comprising a threshold adjusting current source configured for generating a threshold adjusting current and connected to the plurality of single pole switches for transferring the adjusting current through one selected switch of the plurality of switches for adjusting the threshold of the power supply voltage source for activating the electronic device and the threshold for deactivating the electronic device can be modified dependent upon the region of the amplitude of the voltage level of the power supply voltage that provides full functionality for the electronic device.

27. The UVLO circuit of claim 26 further comprising a switch selector in communication with a control terminal for each of the plurality of switches for selecting one of the switches for activation for transferring the adjusting current through one selected switch of the plurality of switches for adjusting the threshold of the power supply voltage source for activating the electronic device and the threshold for deactivating the electronic device.

28. An electronic device comprising:
an under-voltage lockout (UVLO) circuit configured for enabling and disabling an electronic device, if a power supply voltage is at a voltage level that permits the operation of the electronic devices, wherein the UVLO circuit comprises:
a non-differential comparator configured to have a fixed threshold voltage at an input such that when a signal developed from the power supply voltage and a reference voltage is greater than the fixed threshold voltage, an output of the non-differential comparator is placed at a first voltage level and when the signal developed from the power supply voltage and the reference voltage is less than the fixed threshold voltage, an output of the non-differential comparator is placed at a second voltage level, wherein the first and second voltage levels define a comparison output signal;

a voltage divider having a first terminal connected to the power supply voltage and a second terminal connected to receive the reference voltage and configured for dividing a difference in the power supply voltage and the reference voltage such that a compare voltage is applied to the input of the non-differential comparator for comparison with the fixed threshold voltage; and a hysteresis controller configured for adjusting the compare voltage such that if the power supply voltage is less than a falling threshold voltage, the voltage difference between the power supply voltage and the reference voltage is at a first voltage level to make the compare voltage at the voltage level of the fixed threshold voltage and configured for adjusting the compare voltage such that if the power supply voltage is greater than a rising voltage, to make the compare voltage at the voltage level of the fixed threshold voltage to establish hysteresis between the first voltage level and the second voltage level.

29. The electronic device of claim 28 wherein the non-differential comparator comprises:

a flipped gate transistor comprising:
    a gate configured to receive the signal developed from the power supply voltage and the reference voltage,
    a source connected to a ground reference voltage,
    a drain configured for providing the first and second voltage levels at the output of the comparison circuit; and
    wherein the flipped gate transistor is configured such that a gate-to-source threshold voltage is the fixed threshold voltage; and a reference current source having a first terminal connected to the drain of the flipped gate transistor and a second terminal connected to a power terminal of the power supply voltage and configured for providing a reference current for the flipped gate transistor for developing the first and second voltage levels.

30. The electronic device of claim 28 wherein the voltage divider comprises:

a first resistor with a first terminal connected to receive the power supply voltage and a second terminal;
a second resistor with a first terminal connected to the second terminal of the first resistor and a second terminal connected to a gate of the flipped gate transistor;
a voltage to current converter connected for receiving the reference voltage, connected to the junction of the connection between the second terminal of the second resistor and the gate of the flipped gate transistor, and configured for providing a conversion current to the first and second resistors that is proportional to an amplitude of the reference voltage;
wherein, the resistance of the first and second resistors, an amplitude of the power supply voltage, an amplitude of the reference voltage determine the compare voltage applied to the gate of the flipped gate transistor for determining a voltage difference at which the flipped gate transistor will change from the level of the power supply voltage to the level of the reference voltage.

31. The electronic device of claim 30 the voltage to current converter comprises:

a normally gated transistor comprising:
    a drain connected to the gate of the flipped gate transistor and the second terminal of the first resistor,
    a gate connected to reference voltage, and
    a source; and a third resistor having a first terminal connected to the source of the normally gated transistor and a second terminal connected to the ground reference voltage.

32. The electronic device of claim 30 wherein the UVLO circuit further comprises:

an inverter buffer having an input connected to the output of the non-differential comparator and an output connected to circuitry of an electronic device, and configured for receiving the first voltage level and the second voltage level from the non-differential comparator for inverting and buffering the comparison output signal to create the output signal of the UVLO circuit for transfer to the external circuitry indicating that the electronic device is turned on or turned off.

33. The electronic device of claim 32 wherein the inverter buffer comprises:

has a transistor of the first conductivity comprising:
    a source connected to the power supply voltage,
    a drain connected to the external circuitry, and
    a gate connected to the output of the non-differential comparator; and a transistor of the second conductivity, comprising:
    a source connected to the ground reference voltage,
    a drain connected to the drain of the transistor of the first conductivity and to the external circuitry, and
    a gate connected to the output of the non-differential comparator and to the gate of the transistor of the first conductivity.

34. The electronic device of claim 33 wherein the conversion current flows through the first and second resistors to establish the compare voltage at the gate of the flipped gate transistor.

35. The electronic device of claim 32 wherein when the compare voltage at the gate of the flipped gate transistor is greater than the gate to source threshold voltage of the flipped gate transistor, the power supply voltage and the reference voltage are at a voltage difference that the compare voltage will turn on the flipped gate transistor and the input to the inverter buffer becomes approximately the voltage level of the ground reference voltage and the output of the inverter buffer becomes activated to the second logical state.

36. The electronic device of claim 33 wherein when the compare voltage at the gate of the flipped gate transistor becomes is less than the threshold voltage of the flipped gate transistor, the power supply voltage is less than the falling threshold voltage such that the compare voltage will turn off the flipped gate transistor and the input to the inverter buffer becomes approximately the voltage level of the power supply voltage and the output of the inverter buffer becomes deactivated to a first logical state.

37. The electronic device of claim 28 wherein the hysteresis controller comprises:

the third resistor that is placed between the second resistor and the power supply voltage;
a hysteresis control transistor comprising:
    a source connected to the power supply voltage,
    a drain connected to the junction of the connection between the third resistor and the second resistor, and a gate of the hysteresis control transistor connected to the junction of the reference current source and the drain of the flipped gate transistor,
wherein when the flipped gate transistor is turned off, the hysteresis control transistor is also turned off and the power supply voltage has the falling threshold voltage,
wherein when the flipped gate transistor is turned on, the hysteresis control transistor is also turned on, effectively shorting out the third resistor for changing the power supply voltage to have the rising threshold.

38. The electronic device of claim 30 wherein when the compare voltage at the gate of the flipped gate transistor is greater than the gate to source threshold voltage of the flipped gate transistor, the amplitude of the power supply voltage is greater than the rising threshold voltage and the flipped gate transistor turns on such that the input to the inverter buffer becomes approximately the voltage level of the ground reference voltage and the output of the inverter buffer becomes activated to the second logical state, and the electrical device is activated to be fully functional.

39. The electronic device of claim 31 wherein when the compare voltage at the gate of the flipped gate transistor becomes is less than the threshold voltage of the flipped gate transistor, the voltage level of the power supply voltage is less than the falling threshold voltage and the flipped gate transistor turns off such that the input to the inverter buffer becomes approximately the voltage level of the power supply voltage and the output of the inverter buffer becomes deactivated to the first logical state, and the electrical device is deactivated to be turned off.

40. The electronic device of claim 30 wherein the second resistor comprises a plurality of serially connected resistors, wherein a first terminal of a first resistor of the multiple serially connected resistors is connected to the second terminal of the first resistor and a second terminal of a last resistor of the multiple serially connected resistors is connected to the junction of the gate of the flipped gate transistor and the drain of the normally gated transistor.

41. The electronic device of claim 40 wherein when each junction of each of the terminals of the multiple serially connected resistors is connected to one switch of a plurality of single pole switches.

42. The electronic device of claim 41 further comprising a threshold adjusting current source configured for generating an threshold adjusting current and connected to the plurality of single pole switches for transferring the adjusting current through one selected switch of the plurality of switches for adjusting the threshold of the power supply voltage source for activating the electronic device and the threshold for deactivating the electronic device can be modified dependent upon the region of the amplitude of the voltage level of the power supply voltage that provides full functionality for the electronic device.

43. The electronic device of claim 42 further comprising a switch selector in communication with a control terminal for each of the plurality of switches for selecting one of the switches for activation for transferring the adjusting current through one selected switch of the plurality of switches for adjusting the threshold of the power supply voltage source for activating the electronic device and the threshold for deactivating the electronic device.

44. A method for operating an under-voltage lockout (UVLO) circuit of an electronic device comprising the steps of:

providing a non-differential comparator with a fixed threshold within the UVLO circuit;
when the electronic device is turned off, setting an output of the UVLO circuit to a first logical state;
turning off the electronic device;
setting a threshold of a power supply voltage to a rising threshold voltage;
dividing the power supply voltage such that as the power supply voltage increases from an unpowered voltage level to the rising threshold voltage, the output of the UVLO circuit is at the first logical state;
when the power supply reaches and exceeds the rising threshold level at an input of the non-differential comparator, the non-differential comparator switches output voltage state such that the output of the UVLO circuit switches to a second logic state for turning on the electronic device;
setting the threshold of the power supply voltage to a falling threshold voltage
dividing the power supply voltage such that when the power supply voltage decreases from a fully powered voltage level to the falling threshold voltage, the output of the UVLO circuit is at the second logical state;
when the power supply is less than the falling threshold level at the input of the non-differential comparator, the non-differential comparator switches output voltage state such that the output of the UVLO circuit switches to the first logic state for turning off the electronic device; and
setting the threshold of the power supply voltage to the rising threshold voltage.

45. The method claim 44 wherein the non-differential comparator is configured to have a fixed threshold voltage at an input such that when a signal developed from the power supply voltage and a reference voltage is greater than the fixed threshold voltage, an output of the non-differential comparator is placed at a first voltage level and when the signal developed from the power supply voltage and the reference voltage is less than the fixed threshold voltage, an output of the non-differential comparator is placed at a second voltage level.

46. The method of claim 44 wherein the non-differential comparator comprises:
a flipped gate transistor comprising:
a gate configured to receive the signal developed from the power supply voltage and the reference voltage,
a source connected to a ground reference voltage,
a drain configured for providing the first and second voltage levels at the output of the comparison circuit; and
wherein the flipped gate transistor is configured such that a gate-to-source threshold voltage is the fixed threshold voltage; and
a reference current source having a first terminal connected to the drain of the flipped gate transistor and a second terminal connected to a power terminal of the power supply voltage and configured for providing a reference current for the flipped gate transistor for developing the first and second voltage levels.

47. The method of claim 44 wherein dividing the power supply voltage comprises the step of providing a voltage divider, wherein the voltage divider comprises:
a first resistor with a first terminal connected to receive the power supply voltage and a second terminal;

a second resistor with a first terminal connected to the second terminal of the first resistor and a second terminal connected to a gate of the flipped gate transistor; and a voltage to current converter connected for receiving the reference voltage, connected to the junction of the connection between the second terminal of the second resistor and the gate of the flipped gate transistor, and configured for providing a conversion current to the first and second resistors that is proportional to an amplitude of the reference voltage;

wherein, the resistance of the first and second resistors, an amplitude of the power supply voltage, an amplitude of the reference voltage determine the compare voltage applied to the gate of the flipped gate transistor for determining a voltage difference at which the flipped gate transistor will change from the level of the power supply voltage to the level of the ground reference voltage.

48. The method circuit of claim 47 wherein the voltage to current converter comprises:

a normally gated transistor comprising:

a drain connected to the gate of the flipped gate transistor and the second terminal of the first resistor, a gate connected to a biasing reference voltage, and a source; and a third resistor having a first terminal connected to the source of the normally gated transistor and a second terminal connected to the ground reference voltage.

49. The method of claim 48 wherein the conversion current flowing through the third resistor flows through the first and second resistors to establish the compare voltage at the gate of the flipped gate transistor.

50. The method of claim 49 wherein when the compare voltage at the gate of the flipped gate transistor is greater than the fixed threshold voltage of the flipped gate transistor, the power supply voltage is at the rising threshold voltage such that the compare voltage will turn on the flipped gate transistor and the output of the UVLO circuit becomes activated to the second logical state.

51. The method circuit of claim 49 wherein when the compare voltage at the gate of the flipped gate transistor becomes is less than the threshold voltage of the flipped gate transistor, the power supply voltage is at the falling threshold voltage such that the compare voltage will turn off the flipped gate transistor and output of the UVLO circuit becomes deactivated to a first logical state.

52. The method circuit of claim 49 wherein setting the rising threshold voltage and setting the falling threshold voltage each include providing a hysteresis controller configured for adjusting the compare voltage such that when the power supply voltage is less than the rising threshold voltage, the compare voltage is less than the fixed threshold voltage and when the power supply voltage is greater than the falling threshold voltage the compare voltage is greater than the fixed threshold voltage to establish hysteresis between the compare voltage when the power supply voltage is increasing and the compare voltage when the power supply is decreasing.

53. The method circuit of claim 49 wherein the hysteresis controller comprises:

the first resistor that is placed between the second resistor and the power supply voltage;

a hysteresis control transistor comprising:

a source connected to the power supply voltage, a drain connected to the junction of the connection between the third resistor and the second resistor, and a gate of the hysteresis control transistor connected to the junction of the reference current source and the drain of the flipped gate transistor, wherein when the flipped gate transistor is turned off, indicating that the first voltage is less than the second voltage, the hysteresis control transistor is also turned off and the power supply voltage is set at the rising threshold voltage for indicating that the power supply voltage is less than the rising threshold voltage, wherein when the flipped gate transistor is turned on, the hysteresis control transistor is also turned on, effectively shorting out the first resistor for setting the power supply voltage at the falling indicating that the power supply voltage is greater than the falling threshold voltage.

54. The method of claim 49 wherein when the compare voltage at the gate of the flipped gate transistor is greater than the fixed threshold voltage of the flipped gate transistor, the amplitude of the power supply voltage is greater than the rising voltage and the flipped gate transistor turns on such that output of the UVLO circuit is activated to the second logical state, and the electrical device is activated to be fully functional.

55. The method of claim 49 wherein when the compare voltage at the gate of the flipped gate transistor becomes is less than the fixed threshold voltage of the flipped gate transistor, the voltage level of the power supply voltage is less than the rising threshold voltage and the flipped gate transistor turns off such that output of the UVLO becomes deactivated to the first logical state, and the electrical device is deactivated to be turned off.

56. The method of claim 48 wherein the second resistor comprises by a plurality of serially connected resistors, wherein a first terminal of a first resistor of the multiple serially connected resistors is connected to the second terminal of the first resistor and a second terminal of a last resistor of the multiple serially connected resistors is connected to the junction of the gate of the flipped gate transistor and the drain of the normally gated transistor.

57. The method of claim 27 wherein the UVLO circuit further comprises a switch selector in communication with a control terminal for each of the plurality of switches for selecting one of the switches for activation for transferring the adjusting current through one selected switch of the plurality of switches for adjusting the threshold of the power supply voltage for activating the electronic device and the threshold for deactivating the electronic device.

58. The method of claim 57 wherein the UVLO circuit further comprises a threshold adjusting current source configured for generating an threshold adjusting current and connected to the plurality of single pole switches for transferring the adjusting current through one selected switch of the plurality of switches for adjusting the threshold of the power supply voltage at which the electronic device is activated and the threshold at which the electronic device is deactivated can be modified dependent upon the region of the amplitude of the voltage level of the power supply voltage that provides full functionality for the electronic device.

59. The method circuit of claim 58 wherein when each junction of each of the terminals of the multiple serially connected resistors is connected to one switch of a plurality of single pole switches.

* * * * *